(12) United States Patent
Uetake

(10) Patent No.: US 6,900,632 B2
(45) Date of Patent: May 31, 2005

(54) SPIN EXCITING METHOD AND MAGNETIC RESONANCE IMAGING SYSTEM

(75) Inventor: Nozomu Uetake, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/176,539

(22) Filed: Jun. 21, 2002

(65) Prior Publication Data
US 2003/0003053 A1 Jan. 2, 2003

(30) Foreign Application Priority Data
Jun. 28, 2001 (JP) .................................... 2001-196064

(51) Int. Cl.[7] ..................... G01V 3/00; A61B 5/055
(52) U.S. Cl. ................. 324/307; 324/309; 600/410
(58) Field of Search .............................. 324/309, 307, 324/320, 318, 306, 300; 600/410, 420; 424/9.3

(56) References Cited

U.S. PATENT DOCUMENTS

| | | | | |
|---|---|---|---|---|
| 4,585,993 A | * | 4/1986 | Bottomley | 324/309 |
| 4,644,473 A | * | 2/1987 | Kojima et al. | 324/309 |
| 4,654,595 A | * | 3/1987 | Sepponen | 324/309 |
| 4,876,507 A | * | 10/1989 | Van Vaals | 324/307 |
| 4,950,992 A | | 8/1990 | Nakabayashi et al. | |
| 4,970,465 A | | 11/1990 | Hagiwara | |
| 4,983,918 A | | 1/1991 | Nakabayashi | |
| 5,028,871 A | | 7/1991 | Nakabayashi | |
| 5,329,231 A | | 7/1994 | Hatta et al. | |
| 5,557,202 A | | 9/1996 | Miyazaki et al. | |
| 5,677,626 A | * | 10/1997 | Miyazaki et al. | 324/307 |
| 5,722,409 A | | 3/1998 | Kuhara et al. | |
| 5,729,138 A | * | 3/1998 | Purdy et al. | 324/309 |
| 5,757,188 A | | 5/1998 | Miyazaki | |
| 6,016,057 A | * | 1/2000 | Ma | 324/309 |
| 6,046,589 A | | 4/2000 | Lamerichs et al. | |
| 6,275,040 B1 | * | 8/2001 | Zur | 324/320 |
| 6,307,368 B1 | | 10/2001 | Vasanawala et al. | |
| 6,489,770 B1 | * | 12/2002 | Hirata | 324/320 |
| 2003/0003053 A1 | * | 1/2003 | Uetake | 424/9.3 |

* cited by examiner

*Primary Examiner*—Christopher Fulton
*Assistant Examiner*—Tiffany A. Fetzner
(74) *Attorney, Agent, or Firm*—Armstrong Teasdale LLP

(57) ABSTRACT

An object of the present invention is to perform multiple slice imaging accompanied by saturation irrespective of the inhomogeneity of static magnetic field strength. An error of a peak resonant frequency of spins at each slice position is measured. A maximum value is extracted from among errors of peak resonant frequencies of spins in all slices relative to a center frequency with the peak resonant frequency of spins in water between the center frequency and the peak resonant frequency of spins in fat. Spins are excited at a frequency that deviates from the center frequency towards the peak resonant frequency of spins in water by a value calculated by adding the maximum value to a theoretical change in a peak resonant frequency stemming from a chemical shift.

20 Claims, 11 Drawing Sheets

SPIN EXCITING METHOD AND MAGNETIC RESONANCE IMAGING SYSTEM

CROSS REFERENCE TO RELATED APPLICATIONS

This application claims the benefit of Japanese Application No. 2001-196064 filed Jun. 28, 2001.

BACKGROUND OF THE INVENTION

The present invention relates to a spin exciting method, a magnetic resonance imaging method, and a magnetic resonance imaging system. More specifically, it relates to a spin exciting method, a magnetic resonance imaging method, and a magnetic resonance imaging system for producing tomographic images of multiple slices. Herein, spins in an object, in which two kinds of magnetic resonance signals having different frequencies are induced based on chemical shifts, that have one of two peak resonance signals are saturated, and spins that have the other peak resonant frequency are utilized.

In magnetic resonance imaging (MRI) systems, an object of imaging is carried into a bore of a magnet system, that is, an imaging space in which a static magnetic field is created. Magnetic field gradients and a high-frequency magnetic field are applied to the object in order to excite spins in the object. This causes the spins to induce a magnetic resonance (MR) signal. An image is reconstructed based on the received MR signal.

The MR signal utilized for imaging is induced by spins possessed by protons of hydrogen nuclei. The protons exist in water that is a major component of a living body, and are therefore preferably adopted as a signal source necessary to visualize the living body through magnetic resonance imaging.

Since protons also exist in fat, fat also induces a magnetic resonance signal. Due to chemical shifts, the frequency of the magnetic resonance signal induced by spins possessed by the protons of fat is different from the frequency of the one induced by spins possessed by the protons of water. The resonant frequency of fat is lower by an equivalent of approximately 3.5 ppm than the resonant frequency of water.

By utilizing the difference in a resonant frequency, water alone is visualized but fat is not, or fat alone is visualized but water is not. In order to visualize water alone, processing of preventing fat from inducing a magnetic resonance signal is performed in advance. Moreover, in order to visualize fat alone, processing of preventing water from inducing a magnetic resonance signal is performed in advance.

The processing is referred to as saturation, wherein spins possessed by the protons of fat or water are excited and fully diffused so that the spins will not respond to subsequent excitation. Excitation of spins for saturation is initiated with a radio-frequency (RF) signal whose frequency agrees with the resonant frequency of fat or water.

If a static magnetic field is inhomogeneous in strength from site to site in an imaging space, resonant frequencies of spins possessed by protons are uncertain depending on a site. Depending on the degree of uncertainty, the spins to be used for imaging may be saturated. This effect of the uncertainty gets especially outstanding in multiple slice imaging.

SUMMARY OF THE INVENTION

Accordingly, an object of the present invention is to realize a spin exciting method, a magnetic resonance imaging method, and a magnetic resonance imaging system which make it possible to properly perform multiple slice imaging accompanied by saturation irrespective of inhomogeneity in static magnetic field strength.

In this specification, spins possessed by protons of water and spins possessed by protons of fat may be referred to as water and fat respectively. Moreover, the frequency of a magnetic resonance signal induced by the spins possessed by the protons of water may be discussed while being replaced with the resonant frequency of water. Likewise, the frequency of a magnetic resonance signal induced by the spins possessed by the protons of fat may be discussed while being replaced with the resonant frequency of fat.

In this specification, spins possessed by protons of water and used to visualize water alone and spins possessed by protons of fat and used to visualize fat alone may be referred to as spins to be used for imaging. Moreover, spins possessed by protons of fat and saturated for visualization of water alone, and spins possessed by protons of water and saturated for visualization of fat alone may be referred to as spins to be saturated. The spins to be used for imaging are not limited to the spins possessed by the protons of water or fat but may be spins possessed by any kind of nuclei according to the purpose of imaging. The same applies to the spins to be saturated.

(1) According to one aspect of the present invention for solving the foregoing problem, there is provided a spin exciting method for producing tomographic images of multiple slices of an object, in which two kinds of magnetic resonance signals having different frequencies are induced based on chemical shifts, by saturating spins that have one of two peak resonant frequencies, and by utilizing spins that have the other peak resonant frequency. Herein, an error of a peak resonant frequency of spins at each of slice positions specifying multiple slices is measured. A maximum error is extracted from among errors of peak resonant frequencies with the peak resonant frequencies observed between the peak resonant frequency of the spins to be used for imaging and the peak resonant frequency of the spins to be saturated. Spins are excited using an exciting signal whose frequency deviates from the peak resonant frequency of the spins to be used for imaging towards the peak resonant frequency of the spins to be saturated by an equivalent of a value calculated by adding the maximum value to a theoretical change in a peak resonant frequency stemming from a chemical shift.

(2) According to another aspect of the present invention for solving the aforesaid problem, there is provided a magnetic resonance imaging method for producing tomographic images of multiple slices of an object, in which two kinds of magnetic resonance signals having different frequencies are induced based on chemical shifts, by saturating spins that have one of two peak resonant frequencies, and by utilizing spins that have the other peak resonant frequency. Herein, an error of a peak resonant frequency of spins at each of slice positions specifying multiple slices is measured. A maximum value is extracted from among errors of peak resonant frequencies with the peak resonant frequencies observed between the peak resonant frequency of the spins to be used for imaging and the peak resonant frequency of the spins to be saturated. Spins are excited using an exciting signal whose frequency deviates from the peak resonant frequency of the spins to be used for imaging towards the peak resonant frequency of the spins to be saturated by an equivalent of a value calculated by adding the maximum value to a theoretical change in a peak resonant frequency stemming from a chemical shift. The excited spins are then saturated.

(3) According to another aspect of the present invention for solving the aforesaid problem, there is provided a magnetic resonance imaging system for producing tomographic images of multiple slices of an object, in which two kinds of magnetic resonance signals having different frequencies are induced based on chemical shifts, by saturating spins that have one of two peak resonant frequencies, and by utilizing spins that have the other peak resonant frequency. The magnetic resonance imaging system includes a frequency error measuring means, a maximum value extracting means, an exciting means, and a saturating means. The frequency error measuring means measures an error of a peak resonant frequency of spins at each of slice positions specifying multiple slices. The maximum value extracting means extracts a maximum value from among errors of peak resonant frequencies with the peak resonant frequencies observed between the peak resonant frequency of the spins to be used for imaging and the peak resonant frequency of spins to be saturated. The exciting means excites spins using an exciting signal whose frequency deviates from the peak resonant frequency of the spins to be used for imaging towards the peak resonant frequency of the spins to be saturated by an equivalent of a value calculated by adding the maximum value to a theoretical change in a peak resonant frequency stemming from a chemical shift. The saturating means saturates the excited spins.

In the aspects (1) to (3) of the present invention, an error of a peak resonant frequency of spins at each of slice positions specifying multiple slices is measured. A maximum value is extracted from among errors of peak resonant frequencies with the peak resonant frequencies observed between the peak resonant frequency of the spins to be used for imaging and the peak resonant frequency of the spins to be saturated. Spins are excited using an exciting signal whose frequency deviates from the peak resonant frequency of the spins to be used for imaging towards the peak resonant frequency of the spins to be saturated by an equivalent of a value calculated by adding the maximum value to a theoretical change in a peak resonant frequency stemming from a chemical shift. An adverse effect on the spins to be used for imaging at each of the slice positions specifying multiple slices can be canceled.

(4) According to still another aspect of the present invention for solving the aforesaid problem, there is provided a spin exciting method for producing tomographic images of multiple slices of an object, in which two kinds of magnetic resonance signals having different frequencies are induced based on chemical shifts, by saturating spins that have one of two peak resonant frequencies, and by utilizing spins that have the other peak resonant frequency. Herein, an error of a peak resonant frequency of spins at each of slice positions specifying multiple slices is measured. A maximum value is extracted from among errors of peak resonant frequencies with the peak resonant frequencies observed between the peak resonant frequency of the spins to be used for imaging and the peak resonant frequency of the spins to be saturated. Differences of an error of a peak resonant frequency of spins in each slice from errors of peak resonant frequencies of spins in the other slices are calculated. When one of the differences of the errors of the peak resonant frequencies exceeds a predetermined threshold with the peak resonant frequency of the spins to be used for imaging between the peak resonant frequencies and the peak resonant frequency of the spins to be saturated, spins are excited using an exciting signal whose frequency deviates from the peak resonant frequency of the spins to be used for imaging towards the peak resonant frequency of the spins to be saturated by an equivalent of a value calculated by subtracting the threshold from a value calculated by adding the maximum value to a theoretical change in a peak resonant frequency stemming from a chemical shift. When none of the differences exceeds the threshold, spins are excited using an exciting signal whose frequency deviates from the peak resonant frequency of the spins to be used for imaging towards the peak resonant frequency of the spins to be saturated by an equivalent of a value calculated by adding an error of a peak resonant frequency of spins in a slice concerned to a theoretical change in a peak resonant frequency stemming from a chemical shift.

(5) According to still another aspect of the present invention for solving the aforesaid problem, there is provided a magnetic resonance imaging method for producing tomographic images of multiple slices of an object, in which two kinds of magnetic resonance signals having different frequencies are produced based on chemical shifts, by saturating spins that have one of two peak resonant frequencies and by utilizing spins that have the other peak resonant frequency. Herein, an error of a peak resonant frequency of spins at each of slice positions specifying multiple slices is measured. A maximum value is extracted from among errors of peak resonant frequencies with the peak resonant frequencies observed between the peak resonant frequency of the spins to be used for imaging and the peak resonant frequency of the spins to be saturated. Differences of an error of a peak resonant frequency of spins in each slice from errors of peak resonant frequencies of spins in the other slices are calculated. When one of the differences of the errors of the peak resonant frequencies exceeds a predetermined threshold with the peak resonant frequencies observed between the peak resonant frequency of the spins to be used for imaging and the peak resonant frequency of the spins to be saturated, spins are excited using an exciting signal whose frequency deviates from the peak resonant frequency of the spins to be used for imaging towards the peak resonant frequency of the spins to be saturated by an equivalent of a value calculated by subtracting the threshold from a value calculated by adding the maximum value to a theoretical change in a peak resonant frequency stemming from a chemical shift. When none of the differences exceeds the threshold, an exciting signal whose frequency deviates from the peak resonant frequency of the spins to be used for imaging towards the peak resonant frequency of the spins to be saturated by an equivalent of a value calculated by adding an error of a peak resonant frequency of spins in a slice concerned to the theoretical change in a peak resonant frequency stemming from a chemical shift. The excited spins are then saturated.

(6) According to another aspect of the present invention for solving the aforesaid problem, there is provided a magnetic resonance imaging system for producing tomographic images of multiple slices of an object, in which two kinds of magnetic resonance signals having different frequencies are induced based on chemical shifts, by saturating spins that have one of two resonant frequencies and by utilizing spins that have the other resonant frequency. The magnetic resonance imaging system consists mainly of a frequency error measuring means, a maximum value extracting means, a difference calculating means, an exciting means, and a saturating means. The frequency error measuring means measures an error of a peak resonant frequency of spins at each of slice positions specifying multiple slices. The maximum value extracting means extracts a maximum value from among errors of peak resonant frequencies with the peak resonant frequencies observed between the peak resonant frequency of the spins to be used for imaging and the peak resonant frequency of the spins to be saturated. The difference calculating means calculates differences of an error of a peak resonant frequency of spins in each slice from errors of peak resonant frequencies of spins in the other slices. When one of the differences of the errors of the peak resonant frequencies exceeds a predetermined threshold with the peak resonant frequency of the spins to be used for imaging between the peak resonant frequencies and the peak resonant frequency of the spins to be saturated, the exciting means excites spins using an exciting signal whose frequency deviates from the peak resonant frequency of the spins to be used for imaging towards the peak resonant frequency of the spins to be saturated by an equivalent of a value calculated by subtracting the threshold from a value calculated by adding the maximum value to a theoretical change in a peak resonant frequency stemming from a chemical shift. When none of the differences exceeds the threshold, the exciting means excites spins using an exciting signal whose frequency deviates from the peak resonant frequency of the spins to be used for imaging towards the peak resonant frequency of the spins to be saturated by an equivalent of a value calculated by adding an error of a peak resonant frequency of spins in a slice concerned to the theoretical change in a peak resonant frequency stemming from a chemical shift. The saturating means saturates the excited spins.

In the aspects (4) to (6) of the present invention, an error of a peak resonant frequency of spins at each of slice positions specifying multiple slices is measured. A maximum value is extracted from among errors of peak resonant frequencies with the peak resonant frequencies observed between the peak resonant frequency of the spins to be used for imaging and the peak resonant frequency of the spins to be saturated. Differences of an error of a peak resonant frequency of spins in each slice from errors of peak resonant frequencies of spins in the other slices are calculated. When one of the differences of the errors of the peak resonant frequencies exceed a predetermined threshold with the peak resonant frequencies observed between the peak resonant frequency of the spins to be used for imaging and the peak resonant frequency of the spins to be saturated, spins are excited using an exciting signal whose frequency deviates from the peak resonant frequency of the spins to be used for imaging towards the peak resonant frequency of the spins to be saturated by an equivalent of a value calculated by subtracting the threshold from a value calculated by adding the maximum value to the theoretical change in a peak resonant frequency stemming from a chemical shift. When none of the differences exceeds the threshold, spins are excited using an excising signal whose frequency deviates from the peak resonant frequency of the spins to be used for imaging towards the peak resonant frequency of the spins to be saturated by an equivalent of a value calculated by adding an error of a peak resonant frequency of spins in a slice concerned to the theoretical change in a peak resonant frequency stemming from a chemical shift. Consequently, an adverse effect on the spins to be used for imaging at each of slice positions specifying multiple slices can be minimized while saturation can be achieved fully.

In order to visualize water alone, preferably, the spins to be used for imaging are spins possessed by protons of water and the spins to be saturated are spins possessed by protons of fat.

In order to visualize fat alone, preferably, the spins to be used for imaging are spins possessed by protons of fat and the spins to be saturated are spins possessed by protons of water.

Preferably, the measurement is performed periodically during imaging in order to cope with a time-varying drift in static magnetic field strength.

Preferably, when a measured error of a peak resonant frequency exceeds a predetermined limit, the measured value is invalidated in order to cancel the adverse effect of temporal disturbance.

According to the present invention, there are provided a spin exciting method, a magnetic resonance imaging method, and a magnetic resonance imaging system permitting multiple slice imaging accompanied by saturation irrespective of the inhomogeneity of static magnetic field strength.

Further objects and advantages of the present invention will be apparent from the following description of the preferred embodiments of the invention as illustrated in the accompanying drawings.

DETAILED DESCRIPTION OF THE INVENTION

Figure 1:
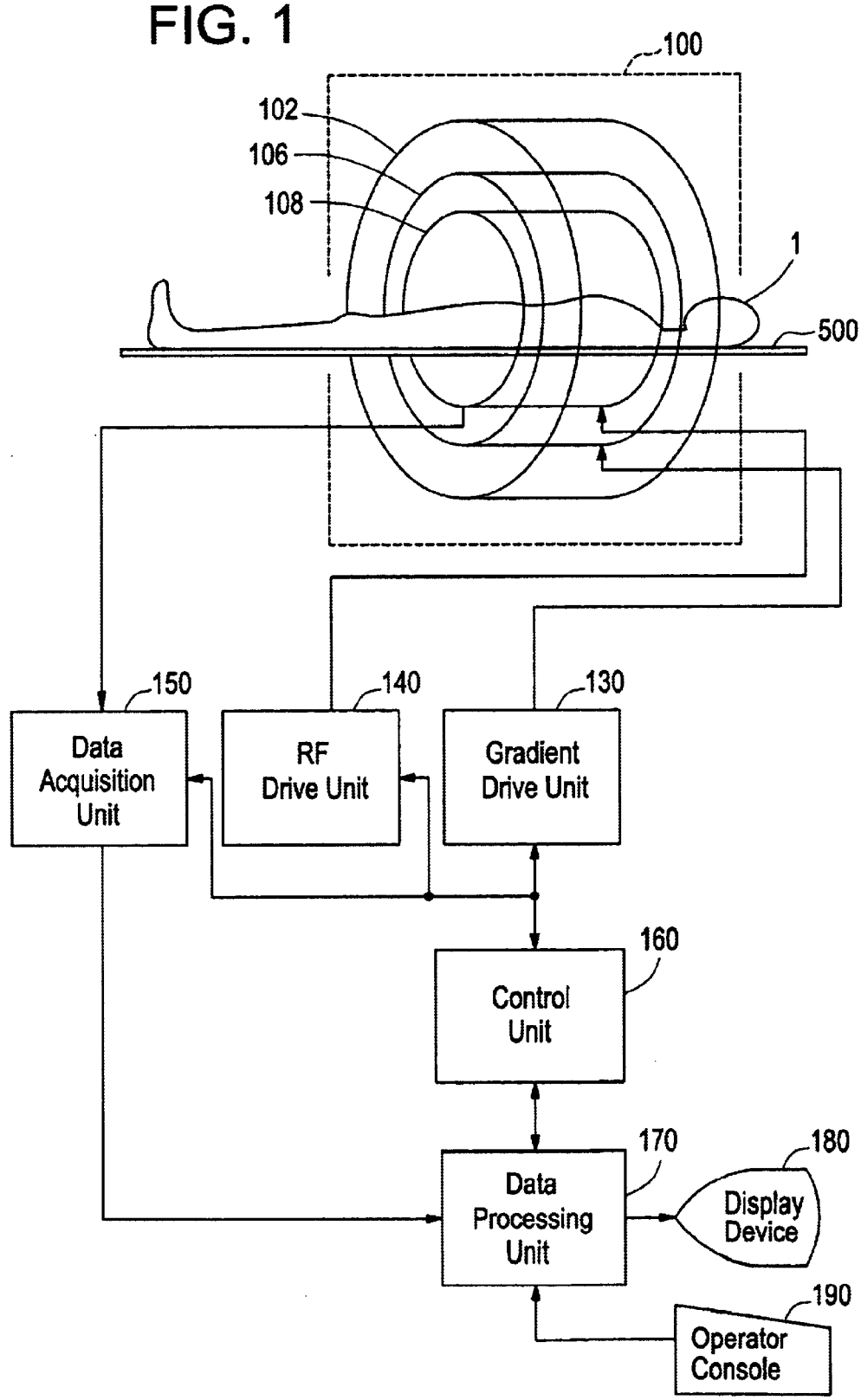
FIG. 1 is a block diagram of an example of a system in accordance with an embodiment of the present invention.

An embodiment of the present invention will be detailed with reference to drawings below. FIG. 1 is a block diagram showing a magnetic resonance imaging (MRI) system. The MRI system is an example of the embodiment of the present invention. The configuration of the MRI system represents the example of the embodiment of the present invention. The actions of the MRI system represent a method implemented in the embodiment of the present invention.

As illustrated, the MRI system includes a magnet system 100. The magnet system 100 includes a main magnetic coil assembly 102, a gradient coil assembly 106, and a radio-frequency (RF) coil assembly 108. These coil assemblies are generally shaped cylindrically and arranged coaxially. An object of imaging 1 is carried into or out of a substantially cylindrical internal space (bore) of the magnet system 100 by means of a transporting means that is not shown while lying down on a cradle 500.

The main magnetic coil assembly 102 creates a static magnetic field in the internal space of the magnet system 100. The direction of the static magnetic field is substantially parallel to the direction of the body axis of the object 1. The static magnetic field is a so-called horizontal magnetic field. The main magnetic coil assembly 102 is realized with, for example, a superconductor. Needless to say, the main coil assembly 102 is not limited to the superconductor but may be realized with a normal conductor.

The gradient coil assembly 106 generates three magnetic field gradients that produce gradients in static magnetic field strength along each of three mutually perpendicular axes, that is, a slice-selecting axis, a phase-encoding axis, and a frequency-encoding axis.

Assuming that the coordinate axes that are mutually perpendicular in the space of a static magnetic field are x, y, and z axes, any of the axes may be regarded as the slice-selecting axis. One of the other two axes is regarded as the phase-encoding axis, and the other axis is regarded as the frequency-encoding axis. The slice-selecting axis, phase-encoding axis, and frequency-encoding axis may be inclined arbitrarily with respect to the x, y, and z axes respectively while being perpendicular to one another. In the present MRI system, the direction of the body axis of the object 1 is regarded as the direction of the z axis.

A magnetic field gradient oriented in the direction of the slice-selecting axis may be referred to as a slice-selecting magnetic field gradient. A magnetic field gradient oriented in the direction of the phase-encoding axis may be referred to as a phase-encoding magnetic field gradient. A magnetic field gradient oriented in the direction of the frequency-encoding axis may be referred to as a readout magnetic field gradient. For generation of the magnetic field gradients, the gradient coil assembly 106 has three gradient coils that are not shown. Hereinafter, a magnetic field gradient may be simply termed a gradient.

The RF coil assembly 108 creates a high-frequency magnetic field, which is used to excite spins in the body of the object 1, in the static magnetic field space. Hereinafter, creation of a high-frequency magnetic field may be implied with transmission of an RF exciting signal. Moreover, the RF exciting signal may be referred to as an RF pulse. The RF coil assembly 108 receives electromagnetic waves induced by excited spins, that is, a magnetic resonance signal (MR signal).

The RF coil assembly 108 has a transmitter coil and a receiver coil that are not shown. The transmitter coil and receiver coil may be realized with a common coil or dedicated coils.

A gradient drive unit 130 is connected to the gradient coil assembly 106. The gradient drive unit 130 applies a driving signal to the gradient coil assembly 106 and thus causes the gradient coil assembly 106 to generate magnetic field gradients. The gradient drive unit 130 has three drive circuits, which are not shown, associated with the three gradient coils included in the gradient coil assembly 106.

An RF drive unit 140 is connected to the RF coil assembly 108. The RF drive unit 140 applies a driving signal to the RF coil assembly 108, whereby an RF pulse is transmitted in order to excite spins in the body of the object 1.

A data acquisition unit 150 is connected to the RF coil assembly 108. The data acquisition unit 150 samples a signal received by the RF coil assembly 108, and acquires the signal as digital data.

A control unit 160 is connected to the gradient drive unit 130, RF drive unit 140, and data acquisition unit 150. The control unit 160 controls the gradient drive unit 130, RF drive unit 140, and data acquisition unit 150 so as to achieve imaging.

The control unit 160 is realized with, for example, a computer. The control unit 160 has a memory that is not shown. Programs for giving instructions to the control unit 160 and various data items are stored in the memory. Facilities of the control unit 160 are implemented when the programs stored in the memory are run by the computer.

The output terminal of the data acquisition unit 150 is connected to a data processing unit 170. Data acquired by the data acquisition unit 150 is transferred to the data processing unit 170. The data processing unit 170 is realized with, for example, a computer. The data processing unit 170 has a memory that is not shown. Programs for giving instructions to the data processing unit 170 and various data items are stored in the memory.

The data processing unit 170 is connected to the control unit 160, and ranks higher than the control unit 160 to centralize the facilities of the control unit 160. The features of the MRI system are realized when the programs stored in the memory are run by the data processing unit 170.

The data processing unit 170 stores data acquired by the data acquisition unit 150 in the memory thereof. A data space is preserved in the memory. The data space is defined as a two-dimensional Fourier transform space that may be referred to as k-space. The data processing unit 170 performs two-dimensional inverse Fourier transform on data in the k-space, whereby an image of the object 1 is reconstructed.

A display device 180 and an operator console 190 are connected to the data processing unit 170. The display device 180 is realized with a graphic display or the like. The operator console 190 is realized with a keyboard having a pointing device.

The display device 180 displays a reconstructed image and various kinds of information provided by the data processing unit 170. A user maneuvers the operator console 190 to enter various commands and information that will be transmitted to the data processing unit 170. The user operates the MRI system interactively through the display device 180 and operator console 190.

Figure 2:
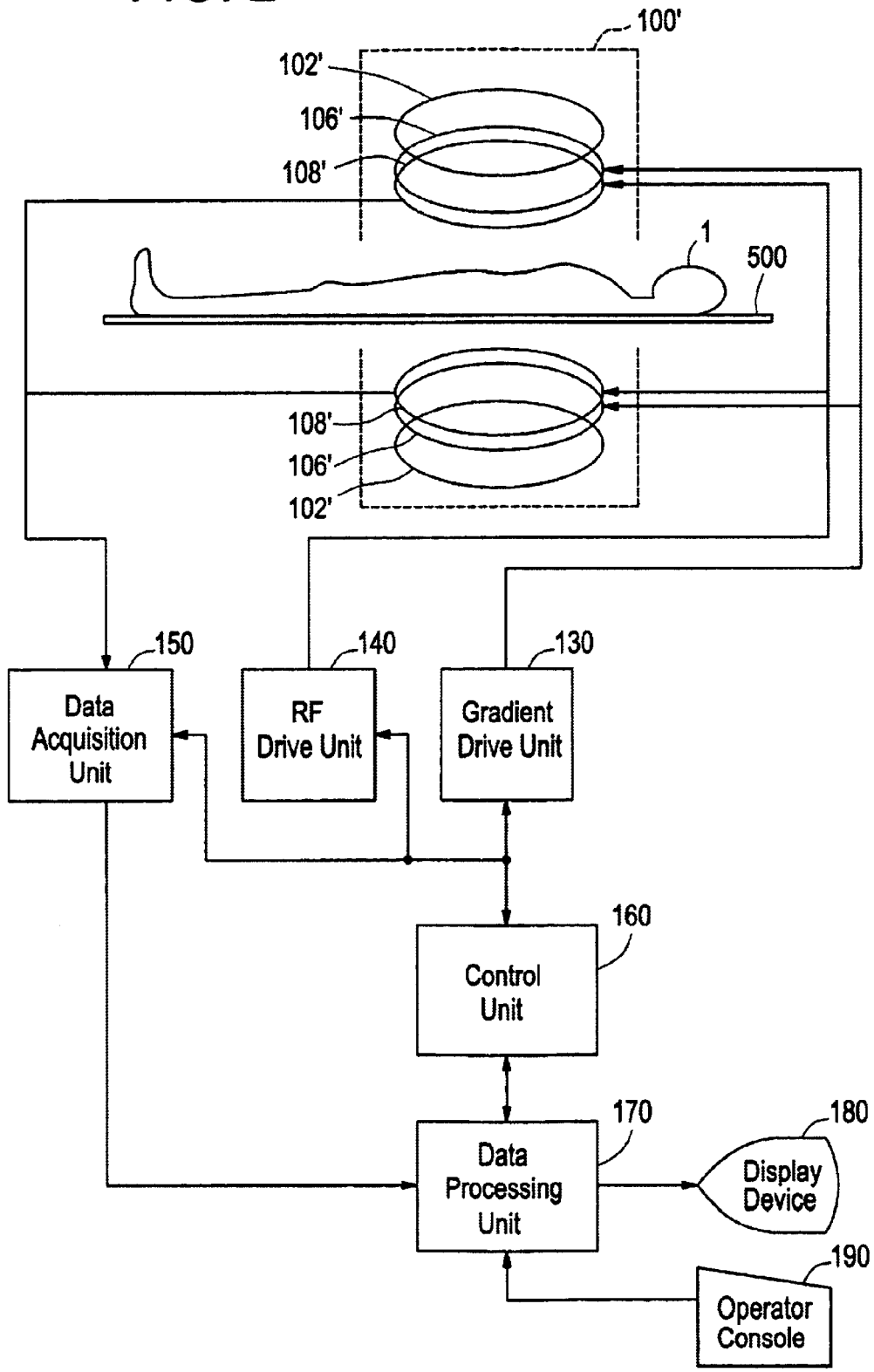
FIG. 2 is a block diagram of another example of the system in accordance with the embodiment of the present invention.

FIG. 2 is a block diagram showing a magnetic resonance imaging system based on another technique. The magnetic resonance imaging (MRI) system shown in FIG. 2 is an example of the embodiment of the present invention. The configuration of the MRI system presents an example of the embodiment of the present invention. The actions of the MRI system present an example of a method implemented in the embodiment of the present invention.

The MRI system includes a magnet system 100' that adopts a technique different from the one shown in FIG. 1. The components of the MRI system other than the magnet system 100' are identical to those of the one shown in FIG. 1. The same reference numerals will be assigned to the identical components, and the description of the components will be omitted.

The magnet system 100' includes a main field magnet assembly 102', a gradient coil assembly 106', and an RF coil assembly 108'. Each of the main field magnet assembly 102', gradient coil assembly, and RF coil assembly is composed of a pair of units opposed to each other with a space between them. Moreover, the main field magnet assembly and coil assemblies have a substantially disk-like shape and share the same center axis. An object 1 is carried into or out of the internal space (bore) of the magnet system 100' by means of a transporting means that is not shown while lying down on a cradle 500.

The main field magnet assembly 102' creates a static magnetic field in the internal space of the magnet system 100'. The direction of the static magnetic field is generally orthogonal to the direction of the body axis of the object 1. The static magnetic field is a so-called vertical magnetic field. The main field magnet assembly 102' is realized with, for example, permanent magnets. Needless to say, the main field magnet assembly is not limited to the permanent magnets but may be realized with superconducting electromagnets or normal conducting electromagnets.

The gradient coil assembly 106' generates three magnetic field gradients that produce gradients in static magnetic field strength in the directions of three mutually perpendicular axes, that is, a slice-selecting axis, a phase-encoding axis, and a frequency-encoding axis.

Assuming that the coordinate axes mutually perpendicular in the space of a static magnetic field are x, y, and z axes, any of the x, y, and z axes may be regarded as a slice-selecting axis. In this case, one of the two remaining axes is regarded as the phase-encoding axis, and the other axis is regarded as the frequency-encoding axis. Moreover, the slice-selecting axis, phase-encoding axis, and frequency-encoding axis may be inclined with respect to the x, y, and z axes while keeping perpendicular to one another. Even in the MRI system, the direction of the body axis of the object 1 shall be regarded as the direction of the z axis.

A magnetic field gradient oriented in the direction of the slice-selecting axis may be referred to as a slice-selecting magnetic field gradient. A magnetic field gradient oriented in the direction of the phase-encoding axis may be referred to as a phase-encoding magnetic field gradient. A magnetic field gradient oriented in the direction of the frequency-encoding axis may be referred to as a readout magnetic field gradient. For generation of the magnetic field gradients, the gradient coil assembly 106' has three gradient coils that are not shown. The portion of the MRI system composed of the gradient coil assembly 106' and gradient drive unit 130 is an example of a gradient applying means employed in the embodiment of the present invention.

The RF coil assembly 108' transmits an RF pulse, with which spins in the body of the object 1 are excited, to the static magnetic field space. The RF coil assembly 108' receives a magnetic resonance (MR) signal induced by the excited spins.

The RF coil assembly 108' includes a transmitter coil and a receiver coil that are not shown. The transmitter coil and receiver coil may be realized with a common coil or with dedicated coils.

Figure 3:
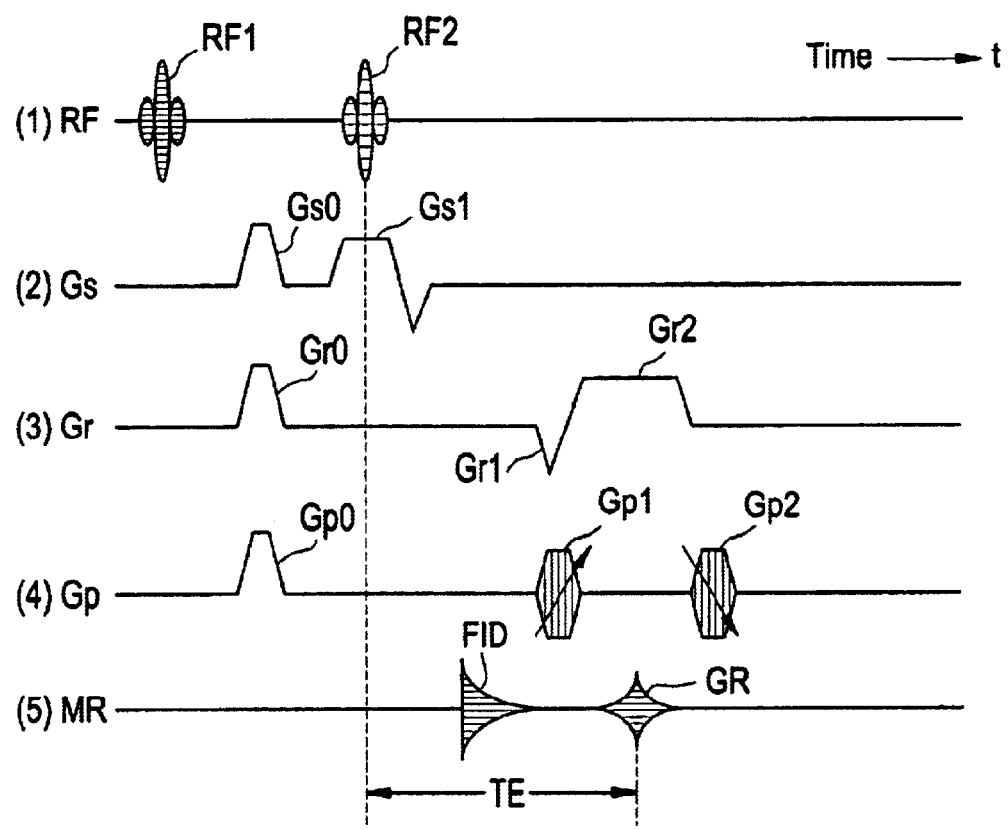
FIG. 3 shows an example of a pulse sequence used for magnetic resonance imaging.

Imaging to be performed by the MRI system will be described below. FIG. 3 schematically shows an example of a pulse sequence to be used to acquire an MR signal in the MRI system shown in FIGS. 1 or 2. The pulse sequence is used to acquire a gradient echo, that is, devised based on a gradient echo imaging technique.

In FIG. 3, (1) shows RF pulses, (2) shows slice-selecting magnetic field gradients Gs, (3) shows readout magnetic field gradients Gr, (4) shows phase-encoding magnetic field gradients Gp, and (5) shows MR signals MR. The pulse sequence progresses from left to right along a time axis t in FIG. 3.

As illustrated, spins are excited with application of an RF pulse RF1. At this time, none of the magnetic field gradients is applied. Namely, non-selective excitation is carried out. The non-selective excitation is intended to excite spins to be saturated. An RF pulse whose frequency is the same as the peak resonant frequency of the spins to be saturated is employed. For example, in order to visualize water, an RF pulse whose frequency is agreed with the resonant frequency of fat is employed. In order to visualize fat, an RF pulse whose frequency is agreed with the resonant frequency of water is employed.

The frequency of the RF pulse RF1 is predetermined to agree with the peak resonant frequency of the spins to be saturated. The way of determining the frequency of the RF pulse RF1 will be described later.

Assuming that water is visualized, an RF pulse whose frequency agrees with the resonant frequency of fat is adopted as the RF pulse RF1 in order to excite the spins in fat. At this time, the RF pulse serving as an exciting pulse is, for example, a 90° pulse. Hereinafter, the RF pulse RF1 may be referred to as a saturation pulse.

After the RF pulse RF1 is applied for excitation, the slice-selecting magnetic field gradient Gs0, readout magnetic field gradient Gr0, and phase-encoding magnetic field gradient Gp0 are applied in order to diffuse the spins in fat.

After the spins in fat are diffused, an RF pulse RF2 is applied for excitation. An RF pulse whose frequency agrees with the resonant frequency of water is adopted as the RF pulse RF2 in order to excite water. At this time, the RF pulse serving as an exciting pulse is an $\alpha°$ ($\leq 90°$) pulse. The resonant frequency of water is determined with a static magnetic field strength and a gyromagnetic ratio. The frequency of the RF pulse RF2 is agreed with the resonant frequency of water. Hereinafter, the RF pulse RF2 may be referred to as an $\alpha°$ pulse. When the $\alpha°$ pulse is applied for excitation, the slice-selecting magnetic field gradient Gs1 is applied for the purpose of selective excitation that is intended to excite spins in a predetermined slice.

The excited spins induce a free induction decay (FID) signal. Since fat is saturated, no FID signal is induced in fat. The FID signal is therefore induced in water alone. The FID signal is received as FID data by the data acquisition unit 150 via the RF coil assembly 108 (108'). The FID data is, as described later, used to calculate an error of a peak resonant frequency of spins lying at a slice position.

After the FID signal decays, the phase-encoding magnetic field gradient Gp1 is applied in order to perform phase encoding on spins lying in the direction of the phase-encoding axis. Moreover, a readout magnetic field gradient Gr1 is applied in order to dephase spins lying in the direction of the frequency-encoding axis. Thereafter, a readout magnetic field gradient Gr2 is applied in order to rephase the spins. This results in a gradient echo GR. Since fat is saturated, the gradient echo GR is induced in water alone.

The gradient echo GR is an RF signal having a waveform symmetrical with respect to the middle of production of an echo. The middle of production of an echo comes in an echo time (TE) after excitation with the $\alpha°$ pulse. The gradient echo GR is acquired as view data by the data acquisition unit 150 via the RF coil assembly (108'). After the acquisition of view data is completed, the phase-encoding magnetic field gradient Gp2 is applied in order to perform phase-encoding in a direction in which a coil would trace if it were rewound.

The pulse sequence is repeated in cycles of a repetition time TR while slice positions are sequentially changed. In order to change slice positions, regions in which spins are excited during selective excitation are changed.

The pulse sequence is repeated, for example, 64 times to 256 times for each slice. At each time of repetition, the phase-encoding magnetic field gradients Gp1 and Gp2 to be oriented in the direction of the phase-encoding axis has the strength thereof changed. Horizontal lines in FIG. 3 conceptually express a sequential change in the strength of the phase-encoding magnetic field gradient. Consequently, 64 to 256 view data items are acquired from each slice at different phases of the slice in the direction of the phase-encoding axis. The thus acquired view data items are stored in the k-space in the memory included in the data processing unit 170 in association with slice positions.

The data in the k-space is subjected to two-dimensional inverse Fourier transform, whereby two-dimensional image data of each slice in an actual space, that is, reconstructed images of multiple slices are produced. The images depict water alone because fat is saturated. The reconstructed images are displayed on the display device 180 and stored in the memory.

Talking of the pulse sequence shown in FIG. 3, needless to say, the saturation pulse RF1 may be a saturation pulse to be used to saturate water. The $\alpha°$ pulse RF2 may be an $\alpha°$ exciting pulse to be used to excite spins in fat. In this case, fat is visualized on behalf of water.

Figure 4:
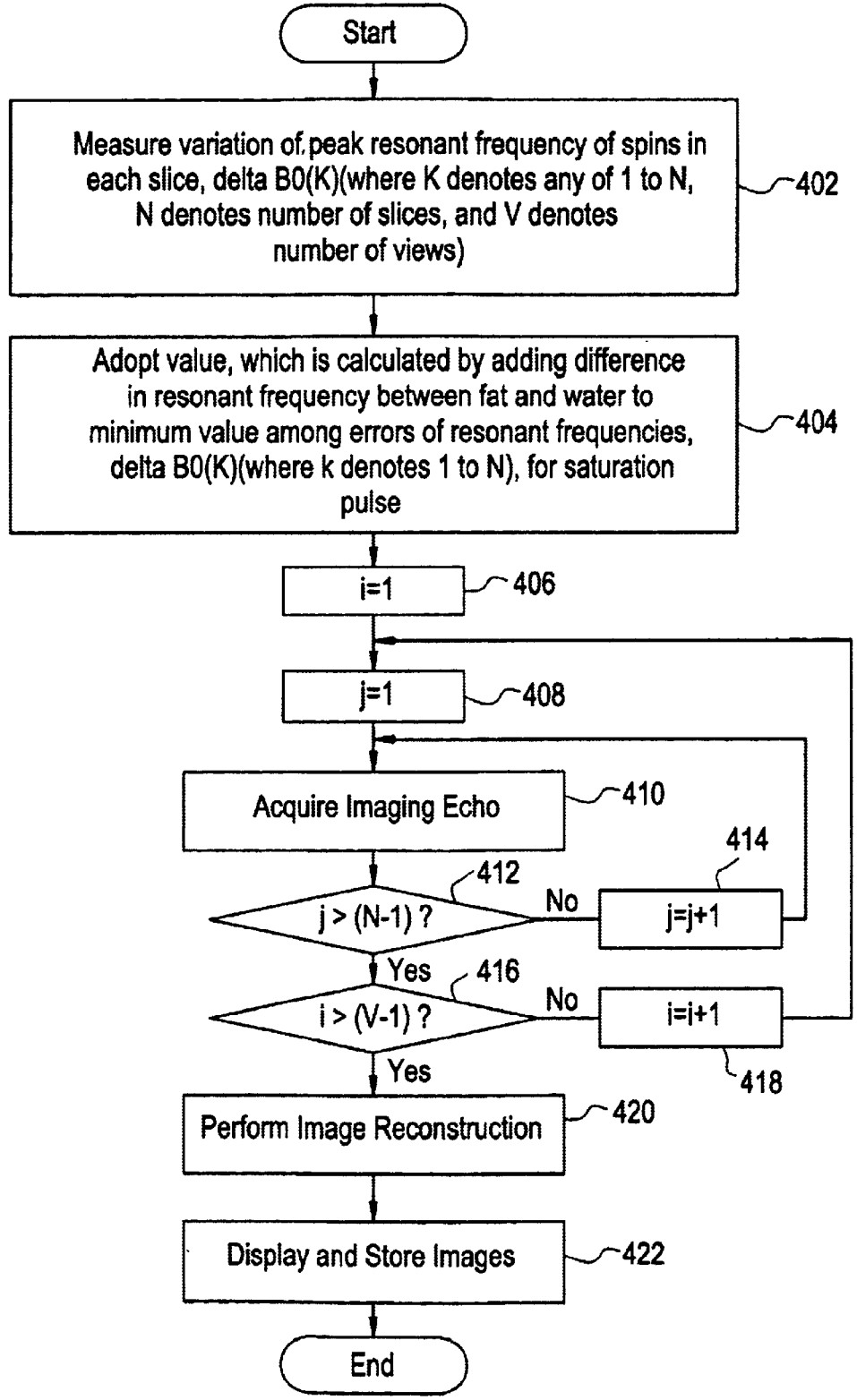
FIG. 4 is a flowchart describing a procedure to be performed by one example of the system in accordance with the embodiment of the present invention.

A description will be made of a frequency determining method for the saturation pulse RF1 that is implemented in order to adopt an imaging technique accompanied by saturation like the aforesaid one. FIG. 4 is a flowchart describing imaging that is performed by the MRI system and involves data processing needed to determine the frequency of the saturation pulse.

As described, at step 402, a variation of a peak resonant frequency of spins in each slice, deltaB0(k), is measured. Herein, k denotes a slice number (k=1 to N). The number of views per slice shall be V. In this specification, the variation of a peak resonant frequency, deltaB0(k), is referred to as an error of a peak resonant frequency.

The measurement of the error of a peak resonant frequency, deltaB0(k), is achieved by detecting an error of a peak resonant frequency of an FID signal, which is induced in water and acquired by adopting the pulse sequence shown in FIG. 3 for each slice, relative to a predetermined center frequency. The predetermined center frequency is determined with a product of a static magnetic field strength (B0) at the center of the magnet system 100 by a gyromagnetic ratio ($\gamma$). The center frequency is an example of the peak resonant frequency of the spins to be used for imaging employed in the embodiment of the present invention.

Figure 5:
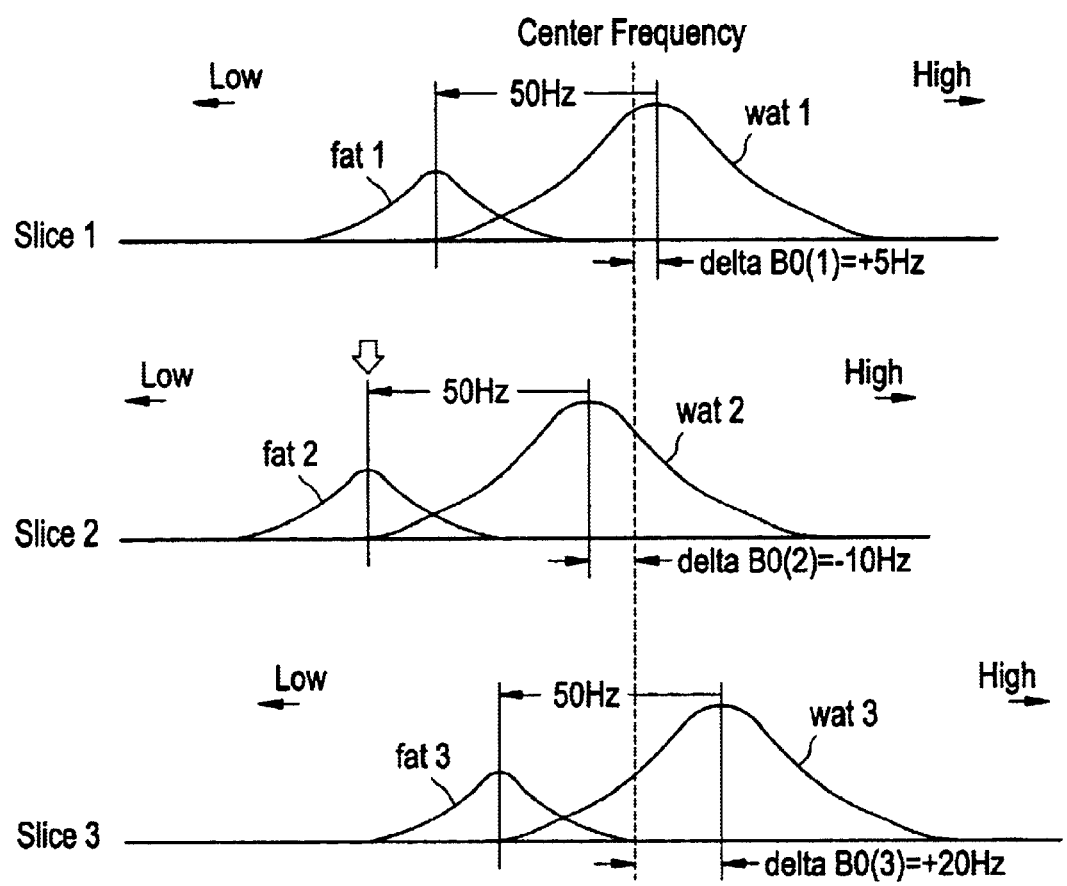
FIG. 5 is a conceptual diagram showing spectra of frequencies of magnetic resonance signals.

FIG. 5 conceptually shows the error of a peak resonant frequency deltaB0(k). In FIG. 5, the number of slices N is 3. Profiles wat1, wat2, and wat3 portray the spectra of resonant frequencies of spins in water in slices 1, 2, and 3 respectively. Profiles fat1, fat2, and fat 3 portray the spectra of resonance frequencies of spins in fat in slices 1, 2, and 3 respectively. Incidentally, as the axis of frequencies goes left to right, the resonant frequency gets higher.

There is a difference stemming from a chemical shift between a peak observed on a profile wat and a peak observed on a profile fat. The difference is theoretically fixed, and is different by approximately 3.5 ppm from the peak on the profile wat. The difference is tentatively set to 50 Hz. In this specification, the difference may be referred to as a theoretical change in a peak resonant frequency stemming from a chemical shift.

As illustrated, the peak on the profile wat1 portraying the spectrum of resonant frequencies of spins in slice 1 is higher by 5 Hz than the center frequency, and expressed as follows:

deltaB0(1)=+5 Hz

The peak on the profile wat2 portraying the spectrum of resonant frequencies of spins in slice 2 is lower by 10 Hz than the center frequency and expressed as follows:

deltaB0(2)=−10 Hz

The peak on the profile wat3 portraying the spectrum of resonant frequencies of spins in slice 3 is higher by 20 Hz than the center frequency and expressed as follows:

deltaB0(3)=+20 Hz

The error of a peak resonant frequency of spins in each slice, deltaB0(k), is attributable to inhomogeneity of static magnetic field strength that varies depending on a site. The error of a peak resonant frequency of spins in each slice, deltaB0(k), is measured at step 502. The data processing unit 170 performs the measurement of the error of a peak resonant frequency deltaB0(k). The data processing unit 170 is an example of a frequency error measuring means employed in the embodiment of the present invention.

At step 404, the frequency of a saturation pulse is determined. For the determination of the frequency, a value calculated by adding a difference in a resonant frequency between fat and water to a minimum value among errors of peak resonant frequencies, deltaB0(k) where k denotes 1 to n, to the saturation pulse is adopted for a saturation pulse.

To be more specific, a minimum value is detected from among the errors of peak resonant frequencies of spins in all slices, deltaB0(k). When it says that an error of a peak resonant frequency assumes the minimum value, it means that the peak resonant frequency most greatly deviates from the center frequency while being lower than that. In other words, the peak resonant frequency is the lowest among the peak resonant frequencies of spins in all the slices.

Referring to FIG. 5, the error of the peak resonant frequency of spins in slice 2, deltaB0(2)=−10 Hz, meets the above condition. Therefore, 10 is extracted as the minimum value. The data processing unit 170 performs the extraction of the minimum value. The data processing unit 170 is an example of a maximum value extracting means employed in the embodiment of the present invention.

A difference in a resonant frequency between fat and water, that is, a theoretical change in a peak resonant frequency stemming from a chemical shift is added to the minimum value. A frequency lower by the value from the center frequency is adopted for a saturation pulse. Consequently, the frequency indicated with an arrow in FIG. 5 is adopted as the frequency of the saturation pulse.

The frequency is the lowest frequency for a saturation pulse among the frequencies therefor adopted for all slices. Therefore, even when a saturation pulse having the frequency is applied to slice 2 whose spins have a peak resonant frequency that deviates most greatly from the center frequency while being lower than that, fat can be saturated without impairment of an MR signal induced in water.

At step 406, a count i is initialized to 1. The count i represents the number of counted views.

At step 408, a count j is initialized to 1. The count j represents the number of counted slices.

At step 410, an imaging echo is acquired. Since j equals 1 and i equals 1, the imaging echo is acquired from the first view of the first slice.

The acquisition of an imaging echo is achieved using the pulse sequence shown in FIG. 3. The frequency determined at step 404 is adopted as the frequency of the saturation pulse RF1.

Consequently, even when the saturation pulse RF1 having the frequency is applied to slice 2 whose spins have a peak resonant frequency that deviates most greatly from the center frequency while being lower than the center frequency, fat can be saturated without impairment of an MR signal induced in water. Consequently, when the RF pulse RF2 that is used as an α° exciting pulse is applied subsequently, a gradient echo GR induced in water can be acquired successfully.

The data processing unit 170, control unit 160, RF drive unit 140, and RF coil assembly 108 are involved in excitation with application of an RF pulse accompanied by saturation. The portion of the MRI system composed of the data processing unit 170, control unit 160, RF drive unit 140, and RF coil assembly 108 is an example of an exciting means employed in the embodiment of the present invention.

After an RF pulse is applied for excitation, the magnetic field gradients Gs, Gr, and Gp are applied for diffusion. Excitation with application of an RF pulse and diffusion result in saturation. The data processing unit 170, control unit 160, RF drive unit 140, RF coil assembly 108, gradient coil assembly 106, and gradient drive unit 130 are involved in the saturation. The portion of the MRI system composed of the data processing unit 170, control unit 160, RF drive unit 140, RF coil assembly 108, gradient coil assembly 106, and gradient drive unit 130 is an example of a saturating means employed in the embodiment of the present invention.

At step 412, it is judged whether the condition of j>(N−1) is met. If not, j is incremented by one at step 414 and control is returned to step 410 of acquisition of an imaging echo. Since j is incremented by one, the next slice is designated.

At step 410, an imaging echo is acquired from the first view of the next slice in the same manner as the aforesaid one. The same steps as those mentioned above are repeated until the condition of j>(N−1) is met. Consequently, an imaging echo is acquired from the first views of all slices.

At step 416, it is judged whether the condition of i>(V−1) is met. If not, i is incremented by one at step 418 and control is returned to step 408. Since i is incremented by one, the next view is designated. At step 408, j is initialized to 1. Consequently, the first slice is designated again.

At step 410, an imaging echo is acquired from the second view of the first slice in the same manner as the foregoing one. The procedure is repeated until the condition of j>(N−1) is met.

The foregoing procedure is repeated until the condition of i>(V−1) is met. Consequently, an imaging echo is acquired from all views of all slices.

Thereafter, at step 420, image reconstruction is performed in order to reconstruct tomographic images of all the slices. These tomographic images are displayed on the display device 180 at step 422, and stored in the memory. Owing to the aforesaid saturation, an MR signal induced in water in any slice will not be impaired. Satisfactory tomographic images depicting water in all the slices can therefore be produced.

Frequency error measurement and saturation frequency determination of steps 402 and 404 respectively may be performed periodically during imaging. In this case, a time-varying drift in a static magnetic field caused by a change in ambient temperature or the like can be coped with properly.

Moreover, an appropriate limit may be set for errors of peak resonant frequencies. Preferably, a measured value of an error of a peak resonant frequency exceeding the limit should be invalidated for fear imaging may be affected by a temporal magnetic disorder stemming from automobiles or the like that happen to run nearby.

Figure 6:
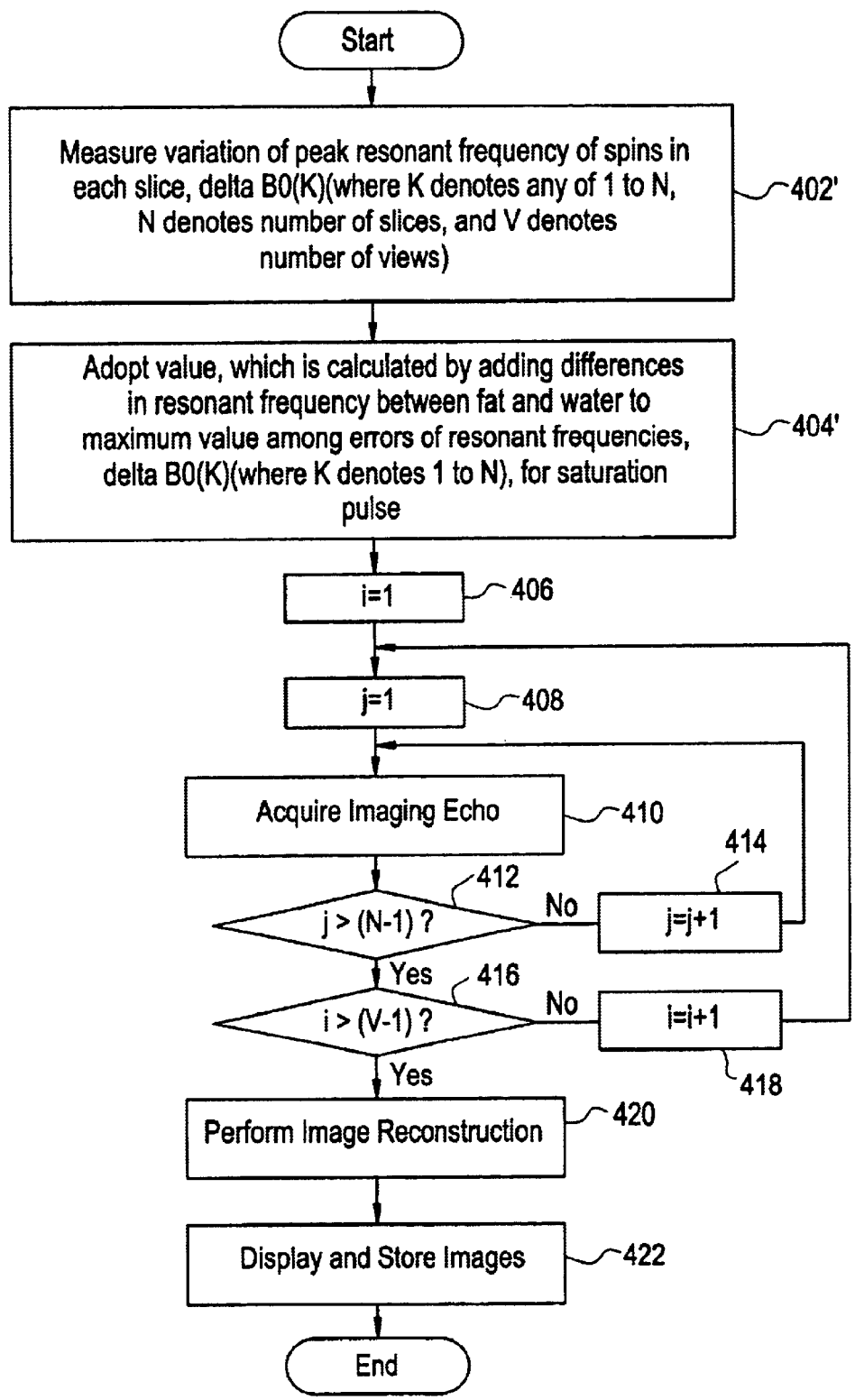
FIG. 6 is a flowchart describing a procedure to be performed by an example of the system in accordance with the embodiment of the present invention.

FIG. 6 is a flowchart describing a procedure for visualizing fat to be performed by the MRI system. The majority of the flowchart is identical to that of the flowchart of FIG. 4. The same reference numerals will be assigned to the common steps and the description of the steps will be omitted. Steps 402' and 404' are different from counterparts in FIG. 4.

At step 402', an error of a peak resonant frequency of spins in fat, deltaB0(k), is measured. For the measurement, the saturation pulse RF1 is applied according to the pulse sequence shown in FIG. 3 in order to saturate water. The α° exciting pulse RF2 is applied in order to excite spins in fat. An FID signal induced by the spins in fat is acquired, and a frequency shift undergone by the signal is measured.

The frequency shift is detected as a deviation from a center frequency. The center frequency is a value smaller by approximately 3.5 ppm than the peak resonant frequency of protons in water. The peak resonant frequency of protons in water is determined with a product of a static magnetic field strength at the center of the magnet system 100 by a gyromagnetic ratio. The center frequency is an example of the peak resonant frequency of spins to be used for imaging which is employed in the embodiment of the present invention.

Figure 7:
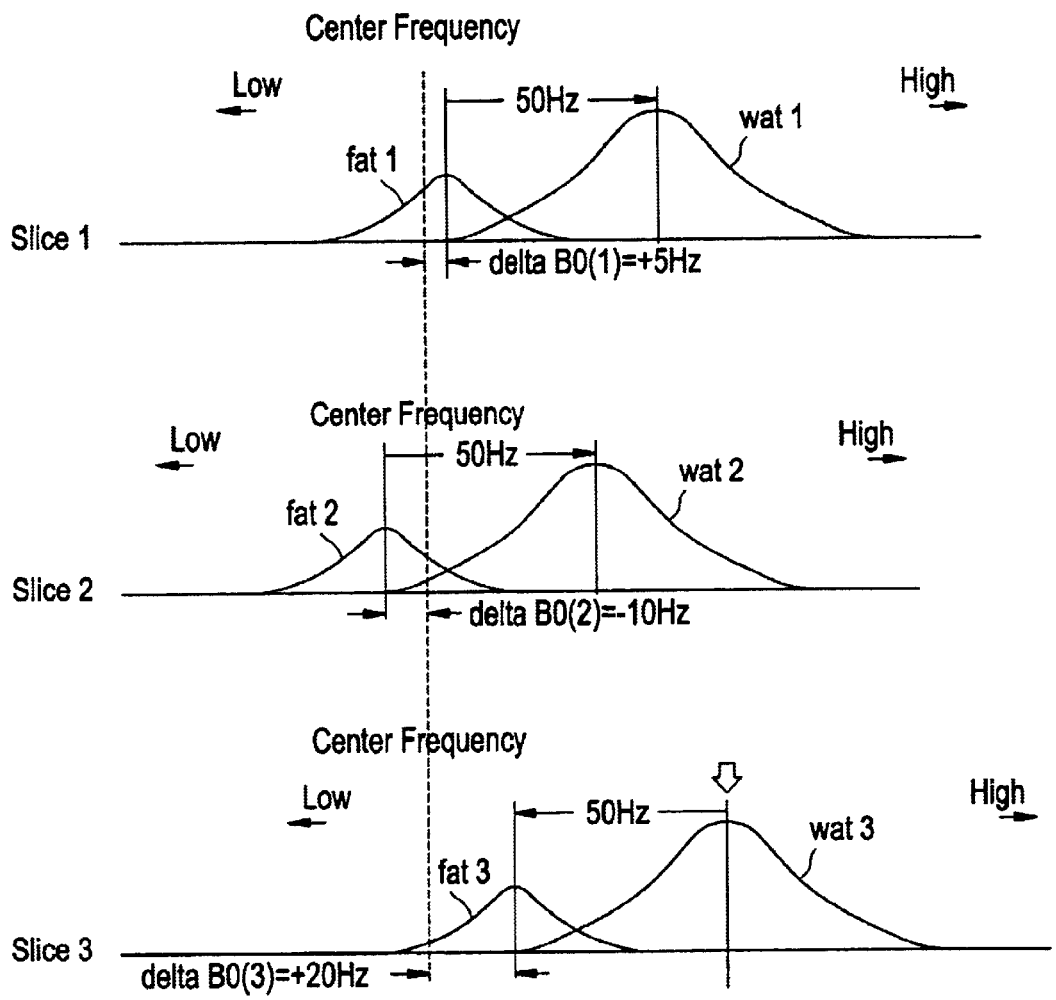
FIG. 7 is a conceptual diagram showing spectra of frequencies of magnetic resonance signals.

FIG. 7 conceptually shows an error of a peak resonant frequency deltaB0(k). FIG. 7 is identical to FIG. 5 except that the center frequency is calculated based on the resonant frequency of fat instead of the resonant frequency of water. As illustrated, the peak on the profile fat1 portraying the spectrum of resonant frequencies of spins in slice 1 is higher by 5 Hz than the center frequency and expressed as follows:

deltaB0(1)=+5 Hz

The peak on the profile fat2 portraying the spectrum of resonant frequencies of spins in slice 2 is lower by 10 Hz than the center frequency and expressed as follows:

deltaB0(2)=−10 Hz

The peak on the profile fat3 portraying the spectrum of resonant frequencies of spins in slice 3 is higher by 20 Hz than the center frequency and expressed as follows:

deltaB0(3)=+20 Hz

At step 404', the errors of the peak resonant frequencies are used to determine the frequency of a saturation pulse. For the frequency determination, a value calculated by adding a difference in a resonant frequency between fat and water to a maximum value out of the errors of peak resonant frequencies, deltaB0(k) (k=1 to N) is adopted for the saturation pulse.

To be more specific, first, a maximum value is extracted from among the errors of peak resonant frequencies of spins in all slices, deltaB0(k) When it says that an error of a peak resonant frequency assumes the maximum value, it means that the peak resonant frequency deviates most greatly while being higher than the center frequency In other words, the peak resonant frequency is the highest among the peak resonant frequencies of spins in all the slices.

Referring to FIG. 7, the error of the peak resonant frequency of spins in slice 3, deltaB0(3)=+20 Hz, meets the above condition. Therefore, 20 is extracted as the maximum value. The data processing unit 170 performs the extraction of a maximum value. The data processing unit 170 is an example of a maximum value extracting means employed in the embodiment of the present invention.

A difference in a resonant frequency between fat and water, that is, a theoretical change in a peak resonance frequency stemming from a chemical shift is added to the maximum value. A frequency higher by the calculated value than the center frequency is adopted for a saturation pulse. Consequently, the frequency indicated with an arrow in FIG. 7 is adopted as the frequency of the saturation pulse.

The frequency is the highest among the frequencies at which a saturation pulse is applied to all slices. Therefore, even when the saturation pulse having the frequency is applied to slice 3 whose spins has a peak resonant frequency that deviates most greatly from the center frequency while being higher than that, water in the slice can be saturated without impairment of an MR signal induced in fat therein.

After the frequency determination is completed, step 406 and subsequent steps are carried out. Consequently, tomographic images of multiple slices depicting fat can be produced. Owing to the foregoing saturation, an MR signal induced in fat will not be impaired in any slice. It is therefore possible to produce satisfactory tomographic images of fat in all slices.

Frequency error measurement and saturation frequency determination of steps 402' and 404' respectively may be carried out periodically during imaging. In this case, a time-varying drift in a static magnetic field caused by a change in ambient temperature can be coped with successfully.

Moreover, an appropriate limit may be set for errors of peak resonant frequencies. Preferably, a measured value of an error of a peak resonant frequency exceeding the limit should be invalidated for fear imaging might be affected by a temporal magnetic variation stemming from automobiles or the like that happen to run nearby.

Figure 8:
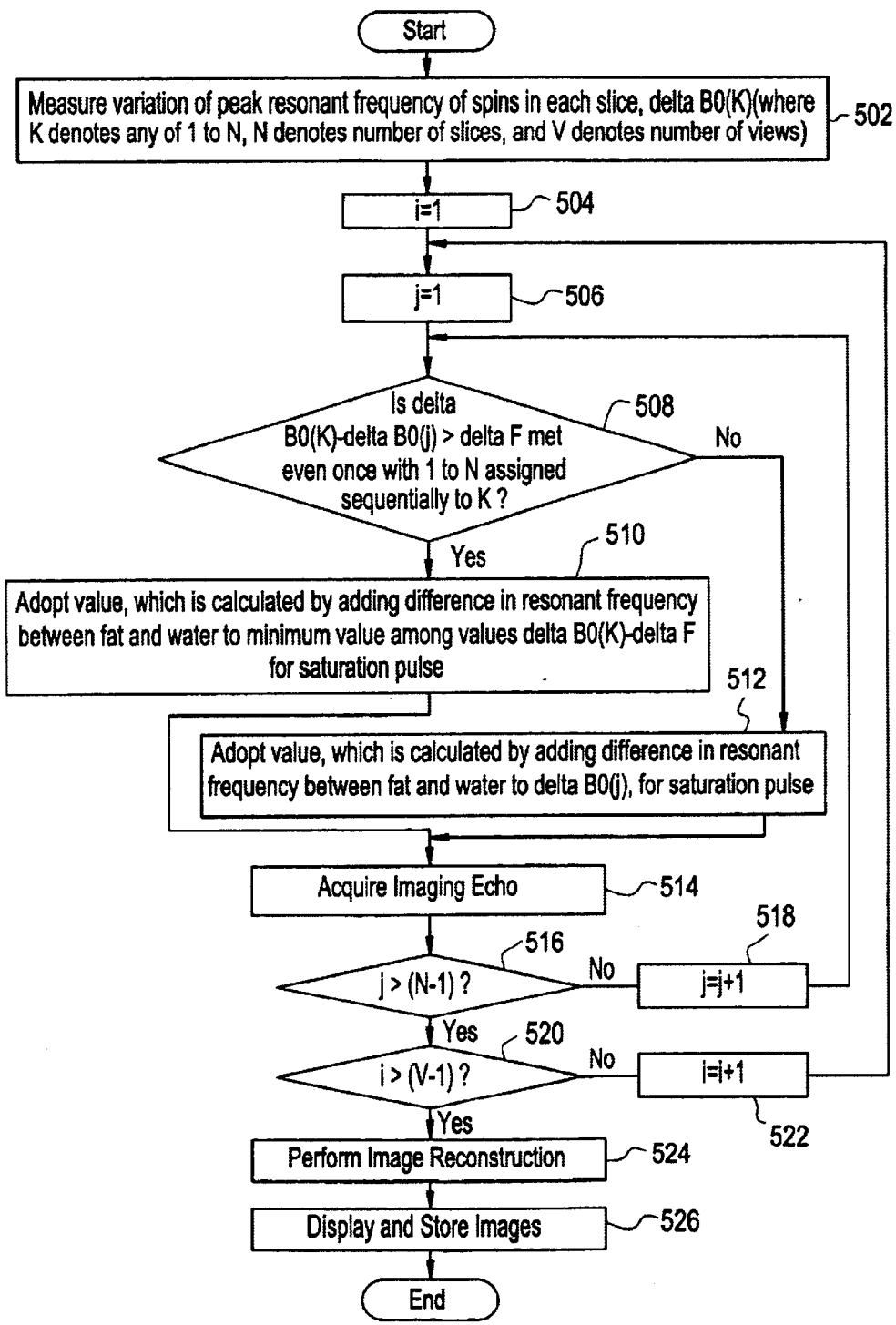
FIG. 8 is a flowchart describing a procedure to be performed by an example of the system in accordance with the embodiment of the present invention.

FIG. 8 is a flowchart describing a procedure for visualizing water. According to the imaging method described in FIG. 4, the frequency of an RF pulse to be applied for saturating fat is shifted based on the maximum value of an error of a peak resonant frequency, which is lower than a center frequency, relative to the center frequency. When an error of a peak resonant frequency differs greatly from slice to slice, fat in some slice may not be saturated satisfactorily. The flowchart of FIG. 8 describes a procedure intended to saturate fat satisfactorily even in such a situation.

Figure 9:
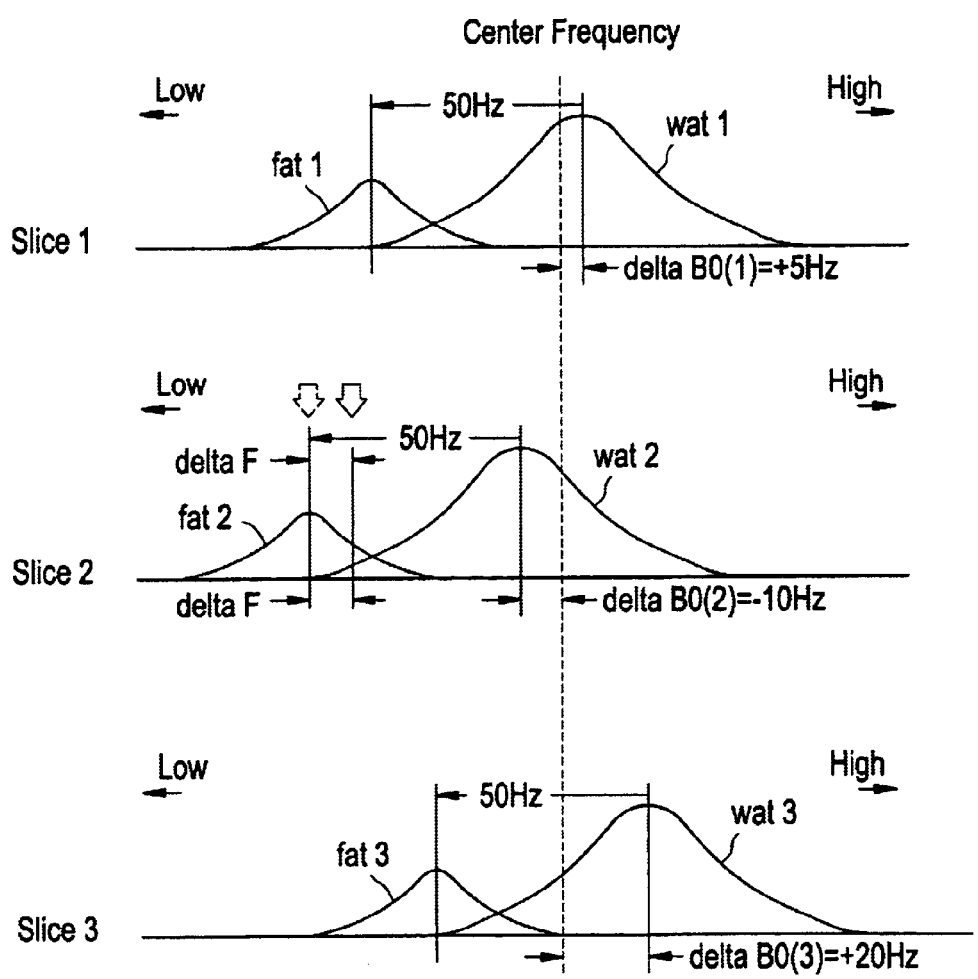
FIG. 9 is a conceptual diagram showing spectra of frequencies of magnetic resonance signals.

As described in FIG. 8, at step 502, a variation of a peak resonant frequency of spins in each slice, deltaB0(k), is measured. This step is identical to step 402 in FIG. 4. Consequently, errors of peak resonant frequencies deltaB0 (1), deltaB0(2), and deltaB0(3) are measured as shown in FIG. 9. FIG. 9 is nearly the same as FIG. 5.

Thereafter, i and j are incremented by one at steps 504 and 506 respectively. These steps are identical to steps 406 and 408.

Thereafter, at step 508, it is judged whether the following condition is met relative to any slice of a slice number k=1 to N:

$$(\text{delta}B0(k) - \text{delta}B0(j)) > \text{delta}F \quad (1)$$

where deltaF represents a predetermined threshold. The threshold is set to, for example, 10. The data processing unit 170 resolves the left side of the expression (1). The data processing unit 170 is an example of a difference calculating means employed in the embodiment of the present invention.

Since j equals 1, deltaB0(1) comes to 5. The left side of the expression (1) is solved by sequentially assigning 1 to N to k. This results in 0, 15, or −15. Since 15 is included, the condition (1) is met.

At step 510, a frequency for a saturation pulse is determined. A value calculated by adding a difference in a resonant frequency between fat and water to a minimum value out of values of deltaB0(k)+deltaF is adopted for the saturation pulse.

To be more specific, first, a minimum value is extracted from among errors of peak resonant frequencies of spins in all slices. When it says that an error of a peak resonant frequency assumes the minimum value, it means that the peak resonant frequency most greatly deviates from the center frequency while being lower than that. In other words, the peak resonant frequency is the lowest among the peak resonant frequencies of spins in all the slices.

Referring to FIG. 9, the error of the peak resonant frequency of spins in slice 2, deltaB0(2)=−10, meets the above condition. Therefore, −10 is extracted as the minimum value. The data processing unit 170 performs the extraction of a minimum value. The data processing unit 170 is an example of a maximum value extracting means employed in the embodiment of the present invention.

A value calculated by adding deltaF to the above value is still a minimum value. The calculated value is 0. A difference in a resonant frequency between fat and water, that is, a theoretical change (50) in a peak resonant frequency stemming from a chemical shift is added to the value of 0. A frequency lower by the calculated value from the center frequency is adopted for a saturation pulse. Consequently, the frequency indicated with an arrow painted in black in FIG. 9 is adopted as the frequency of the saturation pulse.

The frequency is closer to the center frequency by the threshold deltaF than the frequency indicated with an arrow drawn with a dashed line is. The frequency is adopted as the frequency of a saturation pulse to be applied to slice 1. For slice 1, the frequency is closer to the peak on the profile fat1 than the frequency indicated with the arrow drawn with a dashed line is, and permits more successful saturation of fat.

Moreover, the above frequency is close to the resonant frequency of water in slice 2 or any other slice whose spins have a peak resonant frequency that deviates most greatly from the center frequency while being lower than the center frequency. For this reason, the frequency may affect visualization of water in slice 2. However, when the threshold deltaF is set to a proper value, the adverse effect can be limited to a permissible level. Conversely, the threshold deltaF is determined so that the adverse effect will be confined to the permissible level.

Thereafter, an imaging echo is acquired at step 514. This step is identical to step 410. At this time, the frequency determined at step 510 is adopted as the frequency of the saturation pulse RF1. The first view data of slice 1 is then acquired.

At step 516, it is judged whether j>(N−1) is met. If not, j is incremented by one at step 518. These steps are identical to steps 412 and 414 in FIG. 4.

At step 508, the same processing as the foregoing one is performed on slice 2. Since deltaB0(2) equals −10, the solution of the left side of the expression (1) comes to −15, 0, or −30. The aforesaid condition is therefore not met.

Frequency determination is performed at step 512. For the frequency determination, a value calculated by adding a difference in a resonant frequency between fat and water to deltaB0(j) is adopted for a saturation pulse. Since j equals 2, deltaB0(2) comes to −10. Therefore, the frequency indicated with an arrow drawn with a dashed line in FIG. 9 is adopted as the frequency of a saturation pulse to be applied to slice 2. The frequency agrees with the resonant frequency of fat in slice 2.

The frequency is the lowest among the frequencies at which a saturation pulse is applied to all slices.

Consequently, even when the saturation pulse having the frequency is applied to slice 2 whose spins has a peak resonant frequency that most greatly deviated from the center frequency while being lower than that, fat can be saturated without impairment of an MR signal induced in water.

At step 514, an imaging echo is acquired. Consequently, the first view data of slice 2 is acquired. Thereafter, at step 516, it is judged whether j>(N−1) is met. If not, j is incremented by one at step 518.

At step 508, the same processing as the above one is performed on slice 3. Since deltaB0(3) equals 20, the solution of the left side of the expression (1) is 15, 30, or 0. The aforesaid condition is therefore met.

At step 510, a frequency for a saturation pulse is determined in the same manner as the aforesaid one. Consequently, the frequency indicated with an arrow painted in black in FIG. 9 is adopted as the frequency of a saturation pulse to be applied to slice 3.

The frequency is closer to the center frequency by a threshold than the frequency indicated with an arrow drawn with a dashed line is. As far as slice 3 is concerned, the frequency is closer to the peak on the profile fat3 than the frequency indicated with the arrow drawn with the dashed line is. When a saturation pulse having the frequency is applied to slice 3, fat can be saturated more successfully.

The frequency is close to the resonant frequency of water in slice 2 or any other slice whose spins have a peak resonant frequency that most greatly deviates from the center frequency while being lower than that. Therefore, application of a saturation pulse having the frequency may affect visualization of water in slice 2. However, when the threshold deltaF is set to a proper value, the adverse effect can be limited to a permissible level as mentioned above.

At step 516, it is judged whether j>(N−1) is met. If not, j is incremented by one at step 518. The same procedure as the foregoing one is repeated. Consequently, the first view data of the fourth slice and thereafter is acquired.

When the first view data of all slices has been acquired, the condition based on which judgment is made at step 516 is met. At step 520, it is judged whether i>(V−1) is met. If not, i is incremented by one at step 522 and control is returned to step 506. Consequently, acquisition of the second view data is performed on all slices starting with slice 1. The procedure is repeated, whereby multiple slices are scanned.

After scanning is completed, image reconstruction is performed at step 524. At step 526, images are displayed and stored. By following steps 508, 510, and 512, a proper frequency is determined for a saturation pulse to be applied to each slice. Consequently, water in each slice can be visualized more successfully.

The data processing unit 170, control unit 160, RF drive unit 140, and RF coil assembly 108 are involved in excitation with application of an RF pulse that is intended for saturation. The portion of the MRI system composed of the data processing unit 170, control unit 160, RF drive unit 140, and RF coil assembly 108 is an example of an exciting means employed in the embodiment of the present invention.

After excitation with application of an RF pulse is completed, the magnetic field gradients Gs, Gr, and Gp are applied in order to diffuse spins. Excitation with application of an RF pulse and diffusion result in saturation. The data processing unit 170, control unit 160, RF drive unit 140, RF coil assembly 108, gradient coil assembly 106, and gradient drive unit 130 are involved in the saturation. The portion of the MRI system composed of the data processing unit 170, control unit 160, RF drive unit 140, RF coil assembly 108, gradient coil assembly 106, and gradient drive unit 130 is an example of a saturating means employed in the embodiment of the present invention.

Frequency error measurement of step 502 may be performed periodically during imaging. Consequently, a time-varying drift in a static magnetic field caused by a change in ambient temperature can be coped with satisfactorily.

Moreover, an appropriate limit may be set for errors of peak resonant frequencies. Preferably, a measured value of an error of a peak resonant frequency exceeding the limit should be invalidated for fear imaging might be affected with a temporal magnetic disorder caused by automobiles that happen to run nearby.

Figure 10:
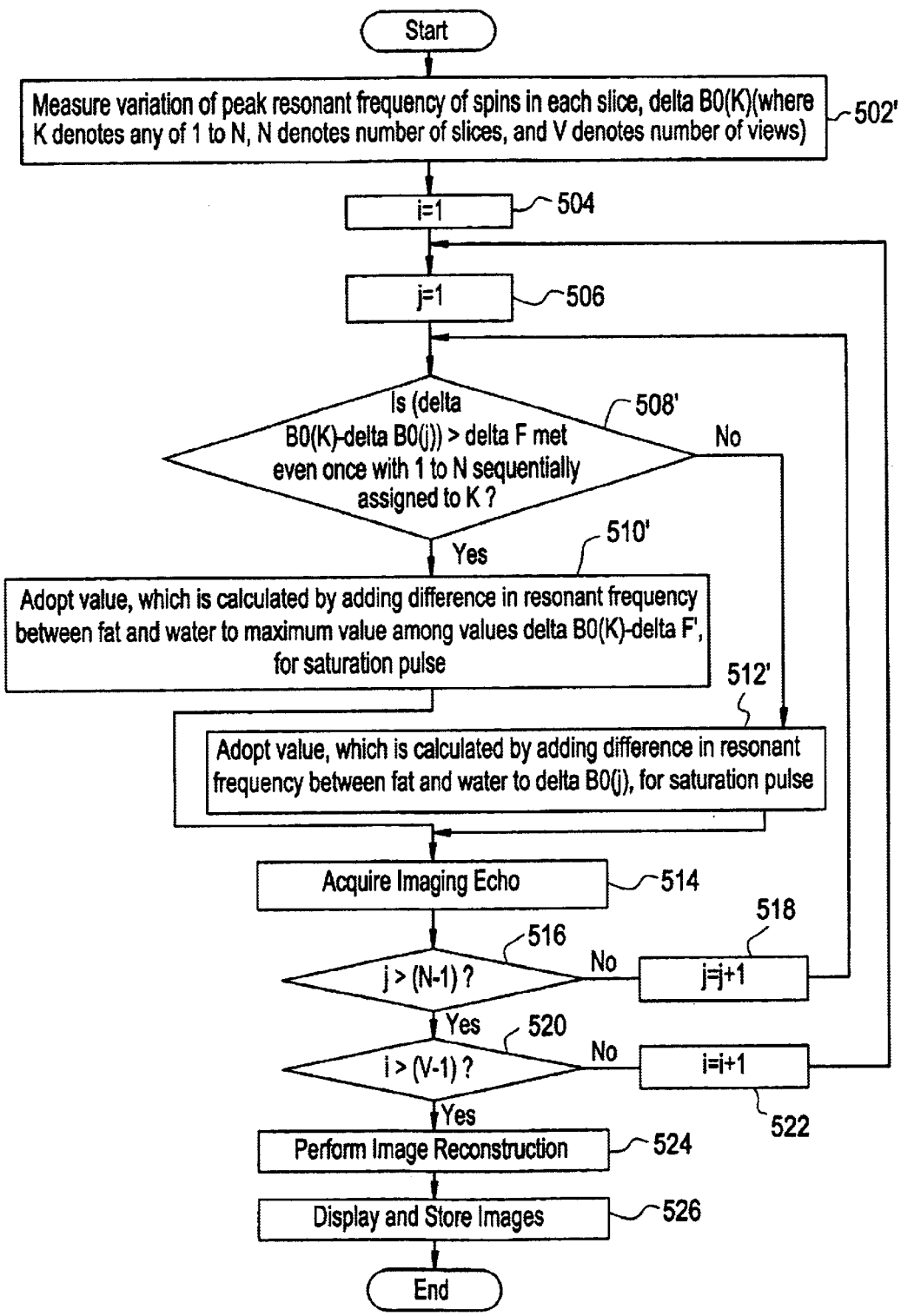
FIG. 10 is a flowchart describing a procedure to be performed by an example of the system in accordance with the embodiment of the present invention.

FIG. 10 is a flowchart describing another procedure for visualizing fat. According to the imaging method described in FIG. 6, the frequency of a saturation pulse to be applied in order to saturate water is shifted based on a maximum error of a peak resonant frequency higher than a center frequency. If the error of a peak resonant frequency greatly differs greatly from slice to slice, water may not always be saturated satisfactorily. Water in some slice may not be saturated at all. The flowchart of FIG. 10 describes the procedure for saturating water satisfactorily even in such a situation.

Figure 11:
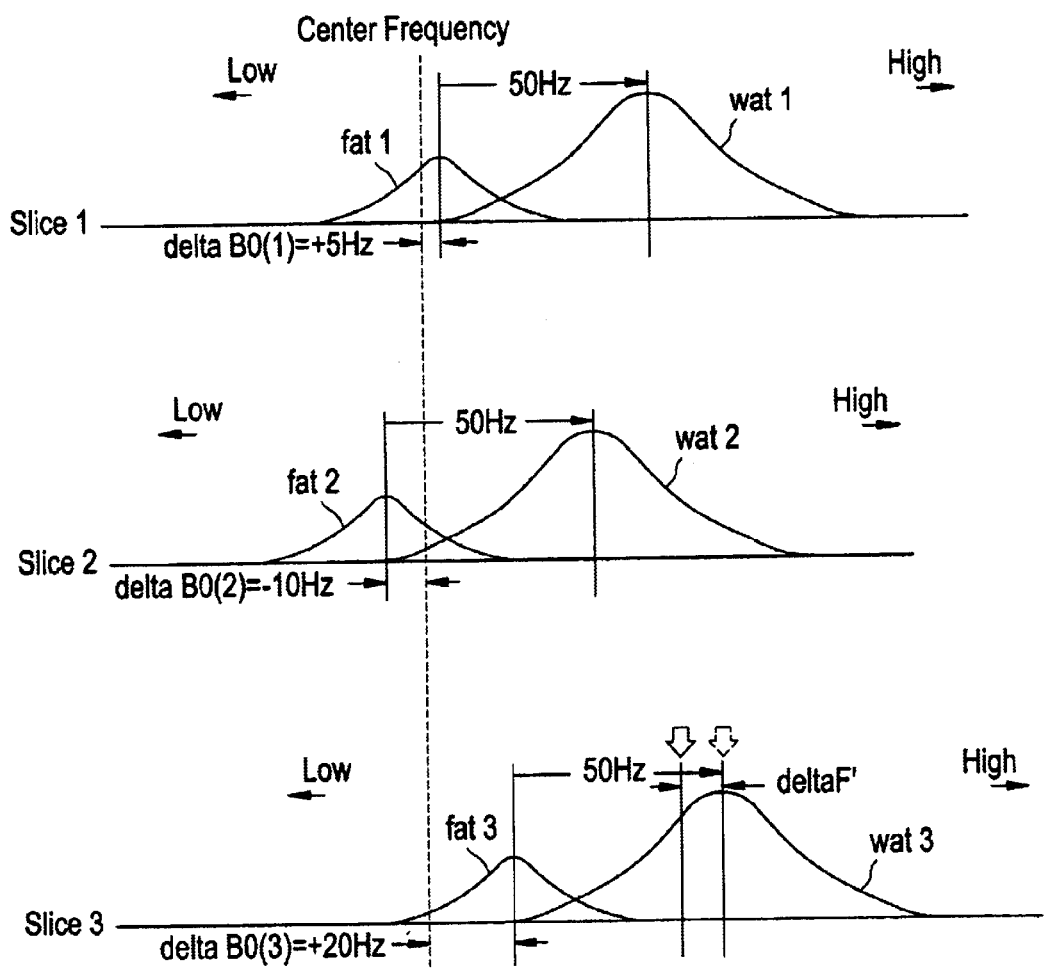
FIG. 11 is a conceptual diagram showing spectra of frequencies of magnetic resonance signals.

As described, at step 502', a variation of a peak resonant frequency of spins in each slice, deltaB0(k), is measured. This step is identical to step 402' in FIG. 6. Consequently, for example, errors of peak resonant frequencies deltaB0(1), deltaB0(2), and deltaB0(3) are obtained as shown in FIG. 11. FIG. 11 is almost the At steps 504 and 506, i and j are initialized to 1. These steps are identical to steps 406 and 408 in FIG. 8.

At step 508, it is judged whether the following condition is met relative to any slice of a slice number k=1 to N:

$$(\text{deltaB0}(k) - \text{deltaB0}(j)) > \text{deltaF'} \tag{2}$$

where deltaF' denotes a predetermined threshold. The threshold is set to, for example, 10. The data processing unit 170 solves the left side of the expression (2). The data processing unit 170 is an example of a difference calculating means employed in the embodiment of the present invention.

Since j equals 1, deltaB0(1) comes to 5. The left side of the expression (2) is solved by assigning 1 to N to k. Consequently, the solution is 0, −15, or 15. Since 15 is included, the above condition is met.

At step 510', a frequency for a saturation pulse is determined. For the frequency determination, a value calculated by adding a difference in a resonant frequency between fat and water to a maximum value out of values of deltaB0(k)−deltaF' is adopted for a saturation pulse.

To be more specific, first, a maximum value is extracted from among errors of peak resonant frequencies of spins in all slices, deltaB0(k). When it says that a peak resonant frequency most greatly deviates from a center frequency while being higher than that, it means that the peak resonant frequency is the highest among all the resonant frequencies of spins in all the slices.

Referring to FIG. 11, the error of the peak resonant frequency of spins in slice 3, deltaB0(3)=20, meets the above condition. 20 is extracted as the maximum value. The data processing unit 170 performs the extraction of a maximum value. The data processing unit 170 is an example of a maximum value extracting means employed in the embodiment of the present invention.

A value calculated by subtracting deltaF' from the above maximum value is still a maximum value among the errors of the peak resonant frequencies of spins in all slices. The resultant value is 10. A difference in a resonant frequency between fat and water, that is, a theoretical change (50) in a peak resonant frequency stemming from a chemical shift is added to the value (10). A frequency higher by the resultant value from the center frequency is adopted as a frequency for a saturation pulse. Consequently, the frequency indicated with an arrow painted in black in FIG. 11 is adopted as the frequency of the saturation pulse.

The frequency is closer to the center frequency by the threshold deltaF' than the frequency indicated with an arrow drawn with a dashed line is. The frequency is adopted as the frequency of a saturation pulse to be applied to slice 1. For slice 1, the frequency is closer to the peak on the profile wat1 than the frequency indicated with the arrow drawn with a dashed line is. The adoption of the frequency enables more satisfactory saturation of water.

Moreover, the frequency is close to the resonant frequency of fat in slice 3 or any other slice whose spins have a peak resonant frequency that most greatly deviates from the center frequency while being higher than that. Application of a saturation pulse having the frequency may affect visualization of fat in slice 3. However, when the threshold deltaF' is set to a proper value, the adverse effect can be limited to a permissible level. Conversely, the threshold deltaF' is set to a value that limits the adverse effect to the permissible level. The threshold deltaF' need not be the same as the aforesaid threshold deltaF.

At step 514, an imaging echo is acquired. This step is identical to step 410 in FIG. 6. However, the frequency determined at step 510' is adopted as the frequency of the saturation pulse RF1. Consequently, the first view data of slice 1 is acquired.

At step 516, it is judged whether j>(N−1) is met. If not, j is incremented by one at step 518. These steps are identical to steps 412 and 414 in FIG. 6.

At step 508', the above processing is repeated for slice 2. Since deltaB0(2) equals −10, the solution of the left side of the expression (2) is 15, 0, or 30. The aforesaid condition is therefore met.

At step 510', a frequency is determined for a saturation pulse in the same manner as the aforesaid one. Consequently, the frequency indicated with an arrow painted in black in FIG. 11 is adopted as the frequency of a saturation pulse to be applied to slice 2. For slice 2, the frequency is closer to the peak on the profile wat2 than the frequency indicated with an arrow drawn with a dashed line is. The adoption of the frequency permits satisfactory saturation of water.

At step 514, an imaging echo is acquired. This step is identical to step 410 in FIG. 6. However, the frequency determined at step 510' is adopted as the frequency of the saturation pulse RF1. Consequently, the first view data of slice 2 is acquired.

At step 516, it is judged whether j>(N−1) is met. If not, j is incremented by one at step 518. These steps are identical to steps 412 and 414 in FIG. 6.

At step 508', the same processing as the above one is performed on slice 3. Since deltaB0(2) equals −10, the solution of the left side of the expression (2) is −10, −30, or 0. The aforesaid condition is therefore not met.

Frequency determination is performed at step 512'. For the frequency determination, a value calculated by adding )a difference in a resonant frequency between fat and water to deltaB0(j) is adopted for a saturation pulse. Since j equals 3, deltaB0(3) comes to 20. Consequently, the frequency indicated with the arrow drawn with a dashed line in FIG. 11 is adopted as the frequency of a saturation pulse to be applied to slice 3. The frequency agrees with the resonant frequency of water in slice 3.

The frequency is the lowest among the frequencies at which a saturation pulse is applied to all slices. Therefore, even when a saturation pulse having the frequency is applied to slice 3 whose spins have a peak resonant frequency that most greatly deviates from the center frequency while being higher than that, water can be saturated without impairment of an MR signal included in water.

At step 514, an imaging echo is acquired. Consequently, the first view data of slice 3 is acquired. At step 516, it is judged whether j>(N−1) is met. If not, j is incremented by one at step 518. The same procedure as the above one is repeated. Consequently, the first view data of the fourth slice and thereafter is acquired sequentially.

When the first view data of all slices has been acquired, the condition based on which judgment is made at step 516 is met. At step 520, it is judged whether i>(V−1) is met. If not, i is incremented by one at step 522 and control is returned to step 506. Consequently, the second view data is acquired from all slices started with slice 1. The procedure is repeated, whereby multiple slices are scanned.

After scanning is completed, image reconstruction is performed at step 524. At step 526, images are displayed and stored. Through steps 508', 510', and 512', an appropriate frequency is determined for a saturation pulse to be applied to each slice. Consequently, fat in each slice can be visualized successfully.

The data processing unit 170, control unit 160, RF drive unit 140, and RF coil assembly 108 are involved in excitation with application of an RF pulse intended for saturation. The portion of the MRI system composed of the data processing unit 170, control unit 160, RF drive unit 140, and RF coil assembly 108 is an example of an exciting means employed in the embodiment of the present invention.

After excitation with application of an RF pulse is completed, the magnetic field gradients Gs, Gr, and Gp are applied in order to diffuse spins. Excitation with application of an RF pulse and diffusion result in saturation. The data processing unit 170, control unit 160, RF drive unit 140, RF coil assembly 108, gradient coil assembly 106, and gradient drive unit 130 are involved in the saturation. The portion of the MRI system composed of the data processing unit 170, control unit 160, RF drive unit 140, RF coil assembly 108, gradient coil assembly 106, and gradient drive unit 130 is an example of a saturating means employed in the embodiment of the present invention.

Frequency error measurement of step 502' may be performed periodically during imaging. Consequently, a time-varying drift in a static magnetic field stemming from a change in ambient temperature can be coped with satisfactorily.

Moreover, an appropriate limit may be set for errors of peak resonant frequencies. Preferably, a measured value of an error of a peak resonant frequency exceeding the limit should be invalidated for fear imaging might be affected by a temporal magnetic disorder caused by automobiles or the like that happen to run nearby.

The preferred embodiment of the present invention has been described by taking examples. An ordinary person skilled in the technical field of the present invention will be able to make various modifications or replacements without departing from the scope of the present invention. The scope of the present invention encompasses not only the aforesaid embodiment but also all embodiments belonging "Claims"

Many widely different embodiments of the invention may be configured without departing from the spirit and the scope of the present invention. It should be understood that the present invention is not limited to the specific embodiments described in the specification, except as defined in the appended claims.

What is claimed is:

1. A spin exciting method for producing tomographic images of multiple slices of an object, in which two kinds of magnetic resonance signals having different frequencies are induced based on chemical shifts, by saturating spins that have one of two peak magnetic resonant frequencies, and by utilizing spins that have the other peak magnetic resonant frequency, said spin exciting method comprising the steps of:

measuring errors of peak magnetic resonant frequencies of spins at each of a plurality of slice positions specifying multiple slices;

extracting a maximum error value from among the errors at each of the slice positions specifying the multiple slices, the peak magnetic resonant frequencies observed between a peak magnetic resonant frequency of a plurality of spins to be used for imaging and a peak magnetic resonant frequency of a plurality of spins to be saturated; and exciting spins using an exciting signal whose frequency deviates from the peak magnetic resonant frequency of the spins to be used for imaging towards the peak magnetic resonant frequency of the spins to be saturated by an equivalent of an additional value calculated by adding the maximum error value to a theoretical change in a peak magnetic resonant frequency stemming from the chemical shift.

2. A spin exciting method according to claim 1, wherein the spins to be used for imaging are spins possessed by protons of water, and the spins to be saturated are spins possessed by protons of fat.

3. A spin exciting method according to claim 1, wherein the spins to be used for imaging are spins possessed by protons of fat, and the spins to be saturated are spins possessed by protons of water.

4. A spin exciting method according to claim 1, wherein said measuring errors of peak magnetic resonant frequencies comprises periodically measuring the errors of peak magnetic resonant frequencies during imaging.

5. A spin exciting method according to claim 1, wherein when a measured value of one of the errors of the peak magnetic resonant frequencies exceeds a predetermined limit, the measured value is invalidated.

6. A spin exciting method according to claim 1 wherein said measuring errors of peak magnetic resonant frequencies comprises calculating a difference between a center frequency and one of the peak magnetic resonant frequencies, wherein the center frequency is a function of a gyromagnetic ratio and a static magnetic field strength.

7. A spin exciting method according to claim 1 wherein the chemical shift is a difference in the peak magnetic resonant frequency of the spins to be saturated and the peak magnetic resonant frequency of the spins to be used for imaging.

8. A spin exciting method according to claim 1 wherein a magnetic field gradient is not applied when the exciting signal whose frequency deviates from the peak resonant frequency of the spins to be saturated by an equivalent of the additional value is applied.

9. A magnetic resonance imaging system configured to produce tomographic images of multiple slices of an object, in which two kinds of magnetic resonance signals having different frequencies are induced based on chemical shifts, by saturating spins that have one of two peak magnetic resonant frequencies, and by utilizing spins that have the other peak magnetic resonant frequency, said magnetic resonance imaging system comprising:

a frequency error measuring device configure to measure errors of peak magnetic resonant frequencies of spins at each of a plurality of slice positions specifying multiple slices;

a maximum value extracting device configure to extract a maximum error value from among the errors at each of the slice positions specifying the multiple slices, the peak magnetic resonant frequencies observed between a peak magnetic resonant frequency of a plurality of spins to be used for imaging and a peak magnetic resonant frequency of a plurality of spins to be saturated;

an exciting device configured to excite spins using an exciting signal whose frequency deviates from the peak magnetic resonant frequency of the spins to be used for imaging towards the peak magnetic resonant frequency of the spins to be saturated by an equivalent of a value calculated by adding the maximum error value to a theoretical change in a peak magnetic resonant frequency stemming from the chemical shift; and a saturating device configured to saturate the excited spins.

10. A magnetic resonance imaging system according to claim 9, wherein the spins to be used for imaging are spins possessed by protons of water, and the spins to be saturated are spins possessed by protons of fat.

11. A magnetic resonance imaging system according to claim 9, wherein the spins to be used for imaging are spins possessed by protons of fat, and the spins to be saturated are spins possessed by protons of water.

12. A magnetic resonance imaging system according to claim 9, wherein said frequency error measuring device measures the errors of peak magnetic resonant frequencies periodically during imaging.

13. A magnetic resonance imaging system according to claim 9, further comprising an invalidating device configured to invalidate a measured value of one of the errors of the peak magnetic resonant frequencies when the measured value exceeds a predetermined limit.

14. A magnetic resonance imaging system configured to produce tomographic images of multiple slices of an object, in which two kinds of magnetic resonance signals having different frequencies are induced based on a chemical shift, by saturating spins that have one of two peak magnetic resonant frequencies, and by utilizing spins that have the other peak magnetic resonant frequency, said magnetic resonance imaging system comprising:

a frequency error measuring device configured to measure errors of peak magnetic resonant frequencies of spins at each of a plurality of slice positions specifying multiple slices;

a maximum error value extracting device configured to extract a maximum error value from among the errors at each of the slice positions specifying the multiple slices, the peak magnetic resonant frequencies observed between a peak magnetic resonant frequency of a plurality of spins to be used for imaging and a peak magnetic resonant frequency of a plurality of spins to be saturated;

a difference calculating device configured to calculate differences of an error of a peak magnetic resonant frequency of spins in each of the multiple slices from remaining errors of peak magnetic resonant frequencies of spins in the remaining slices;

an exciting device configured to excite spins using a first exciting signal whose frequency deviates from the peak magnetic resonant frequency of the spins to be used for imaging towards the peak magnetic resonant frequency of the spins to be saturated by an equivalent of a first value calculated by subtracting a pre-determined threshold from a second value calculated by adding the maximum value to a theoretical change in a peak magnetic resonant frequency stemming from a chemical shift, wherein said exciting device excites spins using the first exciting signal when one of the calculated differences exceeds the pre-determined threshold: and said exciting device configured to excite spins using a second exciting signal whose frequency deviates from the peak magnetic resonant frequency of the spins to be used for imaging towards the peak magnetic resonant frequency of the spins to be saturated by an equivalent of a third value calculated by adding and error of a peak magnetic resonant frequency of spins in one of the multiple slices to the theoretical change in a peak magnetic resonant frequency stemming from the chemical shift, wherein said exciting device excites spins using the second exciting signal when none of the calculated differences exceeds the pre-determined threshold; and a saturating device configured to saturate spins excited by one of the first and the second exciting signal.

15. A magnetic resonance imaging system according to claim 14, further comprising an invalidating device configured to invalidate a measured value of one of the errors of the peak magnetic resonant frequencies when the measured value exceeds a predetermined limit.

16. A magnetic resonance imaging system according to claim 14, wherein the spins to be used for imaging are spins possessed by protons of water, and the spins to be saturated are spins possessed by protons of fat.

17. A magnetic resonance imaging system according to claim 14, wherein the spins to be used for imaging are spins possessed by protons of fat, and the spins to be saturated are spins possessed by protons of water.

18. A magnetic resonance imaging system according to claim 14, wherein said frequency error measuring device measures the errors of peak magnetic resonant frequencies periodically during imaging.

19. A magnetic resonance imaging system according to claim 14 wherein said frequency error measuring device, configured to measure the errors of the peak resonant frequencies, calculates a difference between a center frequency and one of the peak magnetic resonant frequencies, wherein the center frequency is a function of a gyromagnetic ratio and a static magnetic field strength.

20. A magnetic resonance imaging system according to claim 14 wherein a magnetic field gradient is not applied when one of the first and the second exciting signal is applied to excite spins.

* * * * *

UNITED STATES PATENT AND TRADEMARK OFFICE
CERTIFICATE OF CORRECTION

PATENT NO. : 6,900,632 B2
APPLICATION NO. : 10/176539
DATED : May 31, 2005
INVENTOR(S) : Uetake Page 1 of 1

It is certified that error appears in the above-identified patent and that said Letters Patent is hereby corrected as shown below:

In Claim 1, column 21, line 9, delete "on chemical shifts," and insert therefor -- on a chemical shift, --.
In Claim 9, column 21, line 67, delete "on chemical shifts," and insert therefor -- on a chemical shift, --.
In Claim 9, column 22, line 5, delete "configure" and insert therefor -- configured --.
In Claim 9, column 22, line 9, delete "configure" and insert therefor -- configured --.
In Claim 14, column 23, line 20, delete "adding and" and insert therefor -- adding an --.

Signed and Sealed this

Sixth Day of November, 2007

JON W. DUDAS
*Director of the United States Patent and Trademark Office*